US012813126B2

(12) United States Patent
Baeck et al.

(10) Patent No.: US 12,813,126 B2
(45) Date of Patent: Nov. 24, 2026

(54) DISPLAY DEVICE AND METHOD FOR MANUFACTURING THE SAME

(71) Applicant: Samsung Display Co., Ltd., Yongin-si (KR)

(72) Inventors: Dong Gyu Baeck, Yongin-si (KR); Minseok Kim, Yongin-si (KR); Songyi Kim, Yongin-si (KR); Sujin Kim, Yongin-si (KR); Yongseok Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 369 days.

(21) Appl. No.: 18/661,019

(22) Filed: May 10, 2024

(65) Prior Publication Data

US 2025/0056999 A1 Feb. 13, 2025

(30) Foreign Application Priority Data

Aug. 11, 2023 (KR) ........................ 10-2023-0105618

(51) Int. Cl.
*H10K 59/38* (2023.01)
*H10K 59/80* (2023.01)
*H10K 71/13* (2023.01)

(52) U.S. Cl.
CPC ........... *H10K 59/38* (2023.02); *H10K 59/877* (2023.02); *H10K 71/135* (2023.02)

(58) Field of Classification Search
CPC .... H10K 59/38; H10K 59/877; H10K 71/135; H10K 59/8792; H10K 59/10; H10K 71/00; H10K 59/1201; H10K 59/35; H10K 59/8051; H10K 59/8052; H10K 71/40; H10K 2102/331
See application file for complete search history.

(56) References Cited

U.S. PATENT DOCUMENTS

| | | | |
|---|---|---|---|
| 9,575,228 | B2 | 2/2017 | Kim et al. |
| 10,545,379 | B2 | 1/2020 | Lin et al. |
| 11,307,346 | B2 | 4/2022 | Lee |
| 2023/0157119 | A1 | 5/2023 | Choi et al. |
| 2023/0209959 | A1 | 6/2023 | Kwon et al. |

FOREIGN PATENT DOCUMENTS

| | | |
|---|---|---|
| CN | 110109291 | 8/2019 |
| JP | 5538519 | 7/2014 |
| KR | 10-2174381 | 11/2020 |
| KR | 10-2021-0061857 | 5/2021 |
| KR | 10-2023-0073397 | 5/2023 |
| KR | 10-2023-0101989 | 7/2023 |

*Primary Examiner* — Elmito Breval
(74) *Attorney, Agent, or Firm* — CANTOR COLBURN LLP

(57) ABSTRACT

A display device includes a display layer to emit source light, and a light control layer disposed on the display layer to either transmit the source light or wavelength-convert the source light, wherein the light control layer may include a blue light control portion to emit blue light, a green light control portion to emit green light, and a red light control portion to emit red light, and the green light control portion may include multiple first quantum dots and multiple modified scatterers, and the modified scatterers may each include a core portion whose length in a long side direction of the modified scatterer may be 1.5 times or greater than a length in a short side direction of the modified scatterer, and a metal coating portion surrounding at least one of an upper portion and a lower portion of the core portion.

20 Claims, 12 Drawing Sheets

DISPLAY DEVICE AND METHOD FOR MANUFACTURING THE SAME

CROSS-REFERENCE TO RELATED APPLICATIONS

This application claims priority under 35 U.S.C. § 119 from Korean Patent Application No. 10-2023-0105618 filed on Aug. 11, 2023 in the Korean Intellectual Property Office, the entire contents of which are incorporated herein by reference.

BACKGROUND

1. Technical Field

The disclosure relates to a display device including a light control layer containing quantum dots and a method for manufacturing the same.

2. Description of the Related Art

Display devices include a transmissive display device that selectively transmits source light generated from a light source, and a light emitting display device that generates source light from a display device itself. The display devices may include different types of light control portions according to pixels to generate color images. The light control portions may transmit only source light having a wavelength range (e.g., selectable or predetermined wavelength range) or convert the color of source light. Some light control portions may change the properties of light without converting the color of source light.

In the display devices, quantum dot materials may be used in the light control portions, and for the purpose of enhancing the display quality of the display devices, there is a need for developing a technology that allows for an increase in light conversion efficiency or light transmission efficiency in the light control portions.

SUMMARY

The disclosure provides a display device having improved display quality by increasing the transmittance of source light.

The disclosure also provides a method for manufacturing a display device having improved luminance by adjusting scatterers included in a light control portion and the arrangement of the scatterers.

An embodiment of the inventive concept provides a display device that may include a display layer to produce a source light, and a light control layer disposed on the display layer to transmit the source light or wavelength-convert the source light, wherein the light control layer may include a red light control portion to emit red light, a green light control portion to emit green light, and a blue light control portion to emit the source light, the green light control portion may include a plurality of first quantum dots and a plurality of modified scatterers, the plurality of modified scatterers may each include a core portion and a metal coating portion, a length of the core portion in a long side direction of the core portion may be 1.5 times or greater than a length of the core portion in a short side direction of the core portion perpendicular to the long side direction in a cross-section perpendicular to the display layer, the metal coating portion may surround at least one of an upper portion and a lower portion of the core portion, the upper portion and the lower portion of the core portion may be spaced apart in the long side direction.

In an embodiment, the core portion may have a rod-like shape, and the metal coating portion may cover one surface, which is an upper surface or a lower surface of the core portion, and a side surface extending from the one surface.

In an embodiment, the modified scatterers may be arranged such that the long side direction may be perpendicular to an upper surface of the display layer.

In an embodiment, in each of the plurality of modified scatterers, the length in the long side direction may be in a range of about 50 nm to about 500 nm, and the length in the short side direction may be in a range of about 20 nm to about 200 nm.

In an embodiment, the core portion may include $TiO_2$, $SiO_2$, $BaSO_4$, ZnO, $Al_2O_3$, $CaCO_3$, or a combination thereof.

In an embodiment, the metal coating portion may include Al, Cu or a combination thereof.

In an embodiment, the source light may include blue light and green light.

In an embodiment, the source light may include blue light, green light, and red light, and the red light control portion may include the plurality of modified scatterers and a plurality of second quantum dots, the plurality of second quantum dots may be different from the plurality of first quantum dots.

In an embodiment, the blue light control portion may include a plurality of spherical scatterers.

In an embodiment, the display layer may include a light emitting element to emit the source light, and the light emitting element may include a first electrode, a second electrode facing the first electrode, and a light emitting portion disposed between the first electrode and the second electrode.

In an embodiment of the inventive concept, a display device may include a first pixel region to emit red light, a second pixel region to emit green light, and a third pixel region to emit blue light spaced apart from each other and not overlapping each other in a plan view, the display device may further include a display panel including a light emitting element, and a light control panel disposed on the display panel, the light control panel may include a light control layer having a first light control portion corresponding to the first pixel region, a second light control portion corresponding to the second pixel region, and a third light control portion corresponding to the third pixel region, wherein the second light control portion may include a plurality of first quantum dots, and a plurality of rod-like modified scatterers whose length in a first direction parallel to a thickness direction of the light control layer may be about 1.5 times or greater than a length in a second direction perpendicular to the first direction, and the modified scatterers may each include a rod-like core portion, and a metal coating portion may surround at least one of an upper surface and a lower surface of the core portion, the upper surface and the slower surface of the core portion may be spaced apart in the first direction.

In an embodiment, the core portion may include $TiO_2$, $SiO_2$, $BaSO_4$, ZnO, $Al_2O_3$, $CaCO_3$, or a combination thereof, and the metal coating portion may include Al, Cu or a combination thereof.

In an embodiment, the light emitting element may emit source light including the blue light and the green light, the first third light control portion may include a spherical scatterer, and the second light control portion may have no scatterers.

In an embodiment, the light control panel further may include a color filter layer spaced apart from the display panel and disposed on the light control layer, and the color filter layer may include a first color filter overlapping the first pixel region in a plan view to transmit the red light, a second color filter overlapping the second pixel region to transmit the green light, and a third color filter overlapping the third pixel region to transmit the blue light.

In an embodiment of the inventive concept, a method for manufacturing a display device may include forming a display panel that may include a light emitting element, and forming a light control layer, wherein the forming of the light control layer may include forming a division pattern in which a plurality of openings may be defined on a base portion, and forming a blue light control portion, a green light control portion, and a red light control portion that correspond to each of the openings, and the forming of the green light control portion may include disposing quantum dot ink including green quantum dots and modified scatterers in one of the openings corresponding to the green light control portion, aligning the modified scatterers such that long sides of the disposed modified scatterers may be parallel to a thickness direction of the green light control portion, and curing the quantum dot ink after the aligning of the modified scatterers, and each of the modified scatterers may include a core portion whose length in a long side direction may be about 1.5 times or greater than a length in a short side direction perpendicular to the long side direction, and a metal coating portion surrounding at least one of an upper portion and a lower portion of the core portion, and the upper portion and the lower portion of the core portion may be spaced apart in the long side direction.

In an embodiment, the aligning of the modified scatterers may include applying a magnetic field to the quantum dot ink disposed in the one of the openings corresponding to the green light control portion.

In an embodiment, the core portion may include $TiO_2$, $SiO_2$, $BaSO_4$, ZnO, $Al_2O_3$, $CaCO_3$, or a combination thereof, and the metal coating portion may include Al, Cu or a combination thereof.

In an embodiment, the disposing of the quantum dot ink may include spraying the quantum dot ink through an inkjet printing method.

In an embodiment, the curing of the quantum dot ink may include irradiating ultraviolet light into the quantum dot ink.

In an embodiment, the forming of the blue light control portion may include spraying ink containing spherical scatterers into one of the openings corresponding to the blue light control portion through an inkjet printing method, and curing the sprayed ink.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION OF THE EMBODIMENTS

Figure 1:
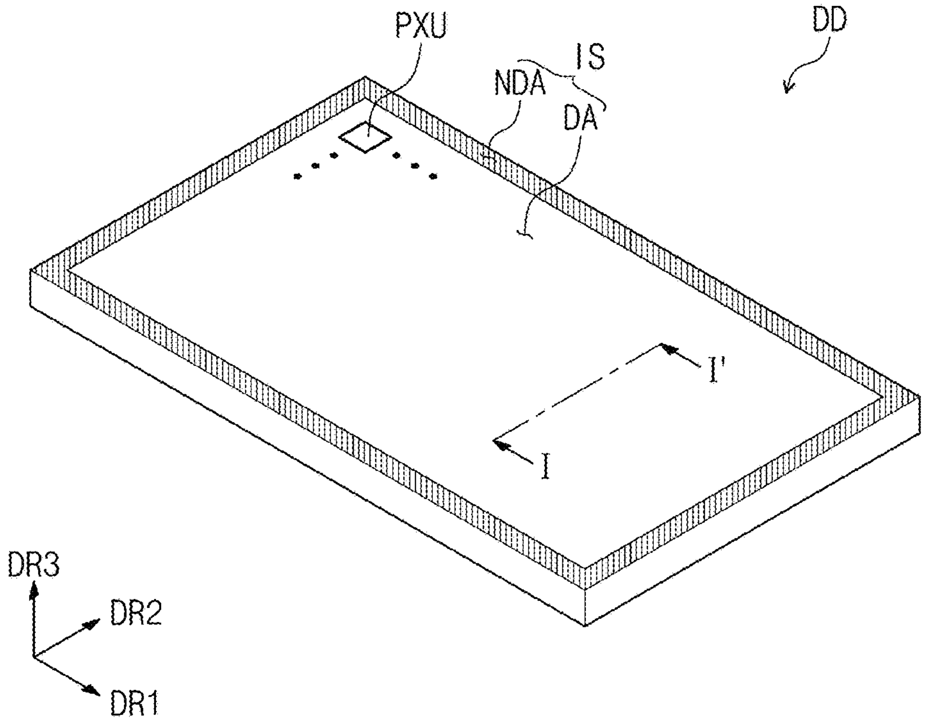
FIG. 1 is a perspective view showing a display device of an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals and/or reference characters denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis or the DR1, DR2, and DR3 directions are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another.

For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As used herein, the term "Group" refers to a group the IUPAC periodic table of elements.

As used herein, "Group II" may include Group IIA elements and Group IIB elements. For example, the Group II elements may be magnesium (Mg) or zinc (Zn), but may not be limited thereto.

As used herein, "Group III" may include Group IIIA elements and Group IIIB elements. For example, the Group III elements may be aluminum (Al), indium (In), or gallium (Ga), but may not be limited thereto.

As used herein, "Group V" may include Group VA elements and Group VB elements. For example, the Group V elements may be phosphorus (P), arsenic (As), or antimony (Sb), but may not be limited thereto.

As used herein, "Group VI" may include Group VIA elements and Group VIB elements. For example, the Group VI elements may be oxygen (O), sulfur(S), selenium (Se) or tellurium (Te), but may not be limited thereto.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, a display device according to an embodiment of the inventive concept and a method for manufacturing the display device of an embodiment will be described with reference to the accompanying drawings.

Figure 2:
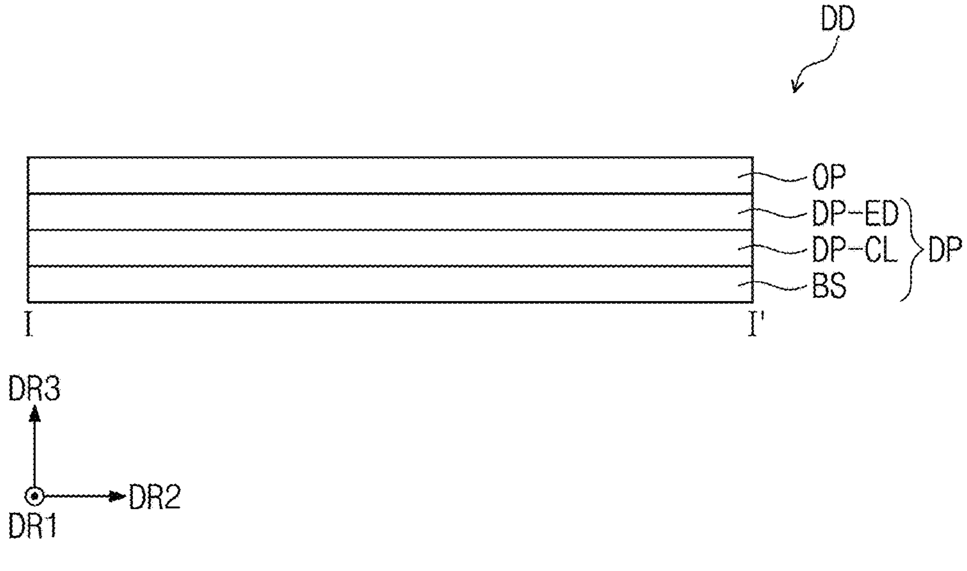
FIG. 2 is a schematic cross-sectional view showing a portion corresponding to line I-I' of FIG. 1.
Figure 3:
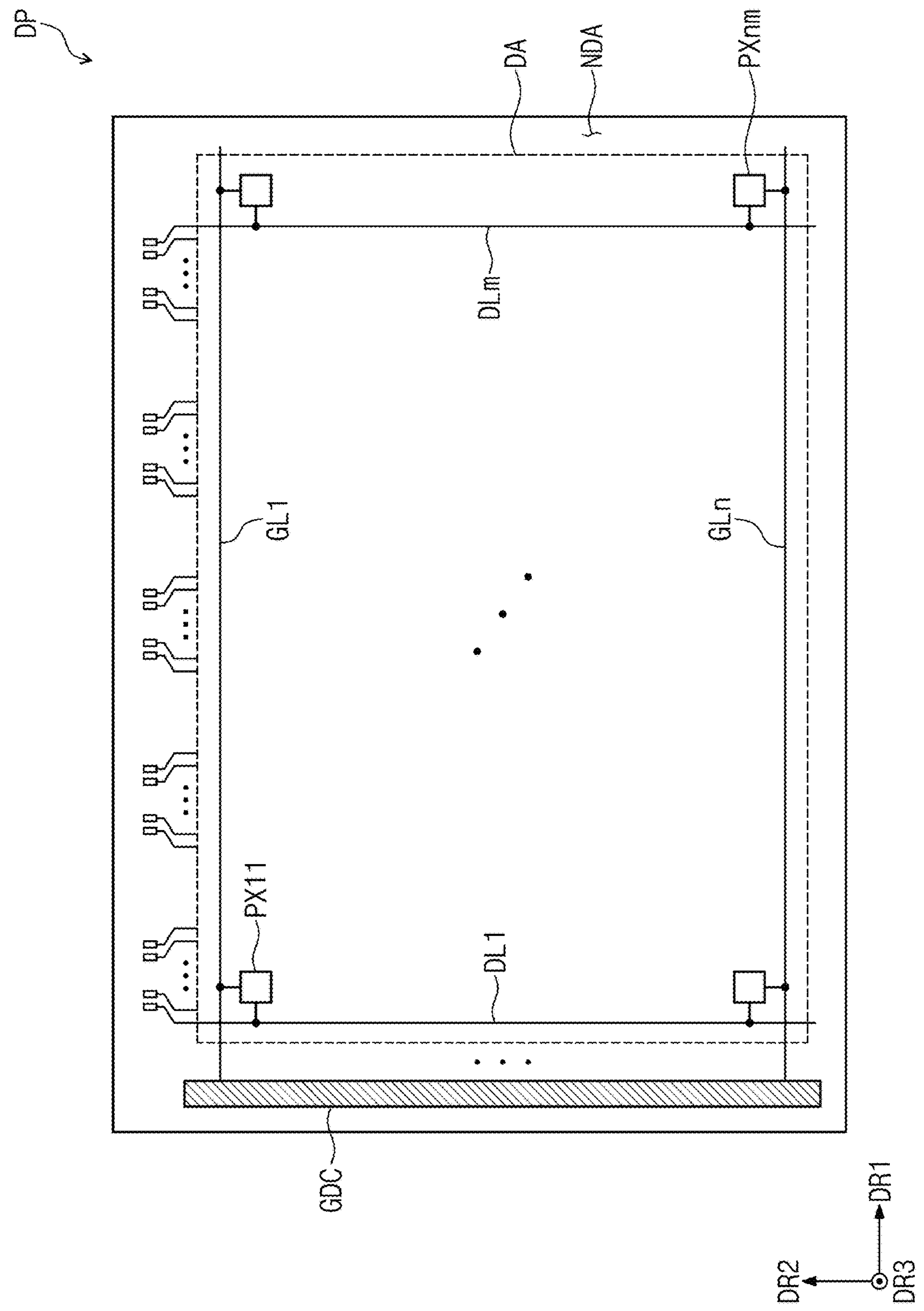
FIG. 3 is a plan view of a display panel according to an embodiment.

FIG. 1 is a perspective view showing a display device according to an embodiment. FIG. 2 is a schematic cross-sectional view of a display device taken in line I-I' of FIG. 1. FIG. 3 is a plan view of a display panel according to an embodiment.

A display device DD may be a device activated according to electrical signals. For example, the display device DD may be a large-sized device such as televisions, monitors, or outdoor billboards. The display device DD may be a small- and medium-sized device such as personal computers, laptop computers, personal digital terminals, car navigation systems, game consoles, smart phones, tablets, and cameras. These devices may be merely provided as embodiments, and other electronic devices may be employed as long as not departing from the inventive concept.

The display device DD may be rigid or flexible. "Flexible" indicates the property of being able to bend. For example, the flexible display device DD may include a curved display device, a rollable display device, or a foldable display device.

FIG. 1 and the following drawings show the first to third directional axes DR1 to DR3, and directions indicated by the first to third directional axes DR1, DR2, and DR3 described herein may be relative concepts, and may thus be changed to other directions. The directions indicated by the first to third directional axes DR1, DR2, and DR3 may be described as first to third directions DR1, DR2, and DR3, and the same reference numerals may be used. The first directional axis DR1 and the second directional axis DR2 herein may be perpendicular to each other, and the third directional axis DR3 may be a normal direction with respect to a plane defined by the first directional axis DR1 and the second directional axis DR2.

A thickness direction of the display device DD may be parallel to the third directional axis DR3 which may be a normal direction with respect to the plane defined by the first directional axis DR1 and the second directional axis DR2. As described herein, a front surface (or an upper surface) and a rear surface (or a lower surface) of members constituting the display device DD may be defined with respect to the third directional axis DR3. The front surface (or upper surface) and the rear surface (or lower surface) of each member constituting the display device DD may oppose each other in the third direction DR3 and a normal direction of each of the front and rear surfaces may substantially be parallel to the third direction DR3. A distance between the front surface and the rear surface defined in the third direction DR3 may correspond to a thickness of a member.

As used herein, "in a plan view" may be defined as a state viewed in the third direction DR3. As used herein, "when viewed on a cross-section" may be defined as a state viewed in the first direction DR1 or the second direction DR2. Directions indicated by the first to third directions DR1, DR2, and DR3 may be relative concepts, and may thus be changed to other directions.

The display device DD may display images (or videos) through a display surface IS. The display surface IS may include a plane defined by a first direction DR1 and a second direction DR2. The display surface IS may include a display region DA and a non-display region NDA. Multiple pixel parts PXU may be disposed in the display region DA, and the pixel parts PXU may not be disposed in the non-display region NDA. The non-display region NDA may be defined in an edge of the display surface IS. The non-display region NDA may surround the display region DA. However, the embodiment of the inventive concept may not be limited thereto, and the non-display region NDA may not be provided or disposed on only one side of the display region DA.

The pixel parts PXU may define pixel rows and pixel columns. The pixel parts PXU may be a minimum repeating unit, and the pixel parts PXU may include at least one pixel. The pixel parts PXU may include multiple pixels providing light of different colors.

In an embodiment of the inventive concept, the display device DD having a planar display surface IS may be shown, but may not be limited thereto. The display device DD may include a curved display surface or a three-dimensional display surface. The three-dimensional display surface may include multiple display regions indicating different directions.

Referring to FIG. 2, the display device DD according to an embodiment may include a display panel DP and a light control panel OP disposed on the display panel DP. The display panel DP may include a base layer BS, a circuit layer DP-CL, and a display layer DP-ED which may be sequentially stacked on each other in a direction of the third directional axis DR3. The light control panel OP may be disposed on the display layer DP-ED. In the display device DD of an embodiment, the light control panel OP may be disposed on (e.g., directly disposed on) the display layer DP-ED.

Herein, when a component is "directly disposed/directly formed" on another component, it indicates that a third component may not be disposed between one component and another component. When a component is "directly placed/directly formed" on another component, it indicates that a component is in "contact" with another component.

Although not shown, in an embodiment, a filling layer (not shown) may be disposed between the display panel DP and the light control panel OP. The display panel DP and the light control panel OP may be disposed to be spaced apart with the filling layer (not shown) therebetween. The light control panel OP may be manufactured in a separate process and then provided on the display panel DP.

In an embodiment, the display panel DP may be referred to as a lower panel or a lower display substrate, and the light control panel OP may be referred to as an upper panel or an upper display substrate.

In the display device DD of an embodiment, the base layer BS may be a support substrate provided with the circuit layer DP-CL and the display layer DP-ED. The circuit layer DP-CL may include at least one insulating layer and a circuit element. The circuit element may include signal lines, pixel driving circuits, and the like. The circuit layer DP-CL may be formed through a process of forming an insulating layer, a semiconductor layer, and a conductive layer by coating, vapor deposition, and the like, and a process of patterning the insulating layer, the semiconductor layer, and the conductive layer by photolithography.

The display layer DP-ED may include display elements. The display device may include a light emitting element that generates light and provides the light to the light control panel OP. The display panel DP including the display layer DP-ED may provide source light to the light control panel OP disposed on an upper portion.

The light control panel OP may convert the wavelength of light provided from the display panel DP or transmit a portion of the provided light. The light control panel OP may include a light control portion that converts or transmits wavelengths, and structures designed to increase the conversion efficiency of emitted light.

FIG. 3 is a plan view of a display panel according to an embodiment. FIG. 3 shows a planar arrangement relationship of signal lines GL1 to GLn and DL1 to DLm and pixels PX11 to PXnm. The signal lines GL1 to GLn and DL1 to DLm may include multiple gate lines GL1 to GLn and multiple data lines DL1 to DLm.

The pixels PX11 to PXnm may be each electrically connected to a corresponding gate line among the gate lines GL1 to GLn and a corresponding data line among the data lines DL1 to DLm. The pixels PX11 to PXnm may each include a pixel driving circuit and a display element. More various types of signal lines may be provided in the display panel DP according to the configuration of the pixel driving circuits of the pixels PX11 to PXnm.

FIG. 3 shows the pixels PX11 to PXnm arranged in a matrix form as an example, but the embodiment of the inventive concept may not be limited thereto. The pixels PX11 to PXnm may be arranged in a PENTILE™ form. For example, points at which the pixels PX11 to PXnm may be disposed may correspond to vertices of a diamond. A gate driving circuit GDC may be integrated on the display panel DP through an oxide silicon gate (OSG) driver circuit process or an amorphous silicon gate (ASG) driver circuit process.

Figure 4:
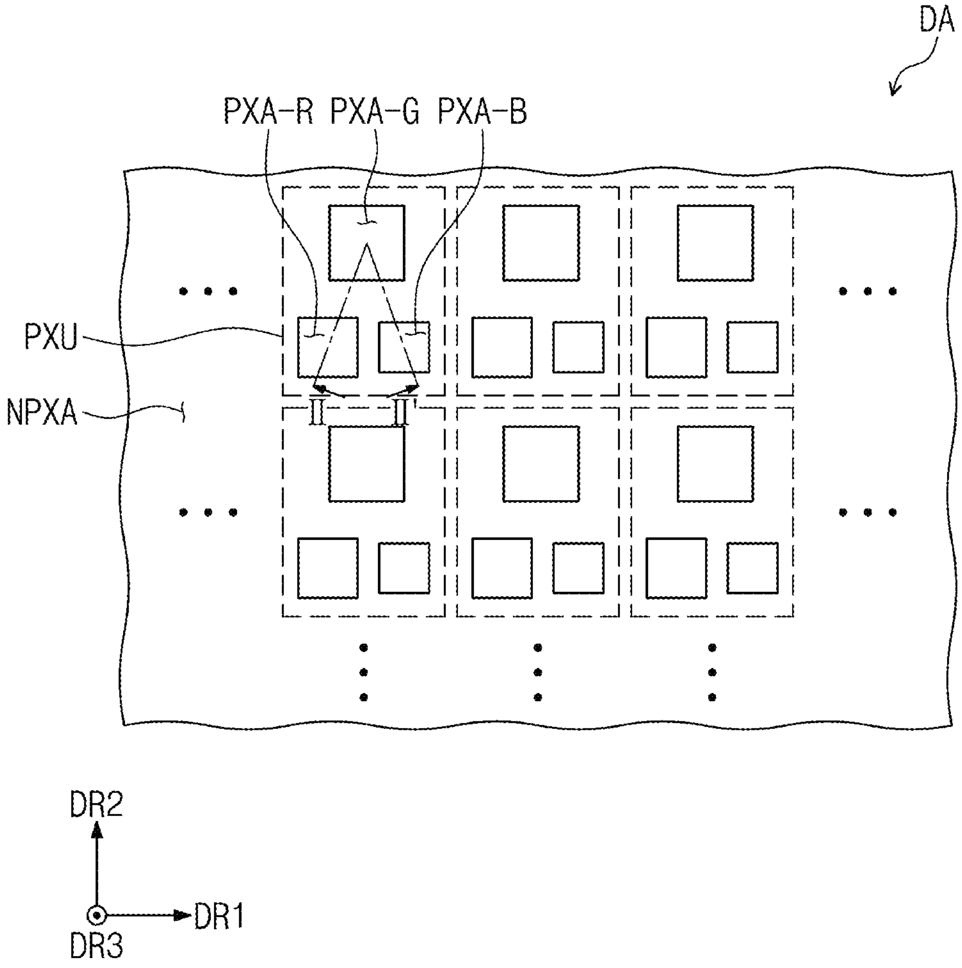
FIG. 4 is a plan view showing a portion of a display device according to an embodiment.

FIG. 4 is a plan view enlarging a portion of a display region in the display device according to an embodiment.

Referring to FIG. 4, in an embodiment, the pixel parts PXU may each be arranged in the first direction DR1 and the second direction DR2. In an embodiment, the pixel parts PXU may include a first pixel, a second pixel, and a third pixel, which emit light in different wavelength ranges. Red light, green light, and blue light may be emitted from the first pixel, the second pixel, and the third pixel, respectively. In FIG. 4, a first pixel region PXA-R, a second pixel region PXA-G, and a third pixel region PXA-B may be shown to represent the first pixel, the second pixel, and the third pixel, respectively. The first pixel region PXA-R may be a region in which light generated from the first pixel may be provided to the outside, the second pixel region PXA-G may be a region in which light generated from the second pixel may be provided to the outside, and the third pixel region PXA-B may be a region in which light generated from the third pixel may be provided to the outside. The first to third pixel regions PXA-R, PXA-G, and PXA-B may not overlap and be separated from each other in a plan view.

In an embodiment, the first pixel region PXA-R may be a red light emitting region emitting red light, the second pixel region PXA-G may be a green light emitting region emitting green light, and the third pixel region PXA-B may be a blue light emitting region emitting blue light. However, the embodiment of the inventive concept may not be limited thereto, and in an embodiment, the display region DA may further include a pixel region that emits white light, in addition to the first to third pixel regions PXA-R, PXA-G, and PXA-B.

The peripheral region NPXA may be arranged to surround each of the first pixel region PXA-R, the second pixel region PXA-G, and the third pixel region PXA-B. The peripheral region NPXA may be disposed between the first to third pixel regions PXA-R, PXA-G, and PXA-B. The peripheral region NPXA may set a border between the first to third pixel regions PXA-R, PXA-G, and PXA-B to prevent the first to third pixel regions PXA-R, PXA-G, and PXA-B from being color mixed. A structure that prevents color mixing between the first to third pixel regions PXA-R, PXA-G, and PXA-B, for example, a pixel defining layer PDL (FIG. 5) or a division pattern BMP (FIG. 5) may be disposed in the peripheral region NPXA.

FIG. 4 shows, as an example, the display device DD (FIG. 1) that may include the first to third pixel regions PXA-R, PXA-G, and PXA-B having the same planar shape and having different planar areas, but the embodiment of the inventive concept may not be limited thereto. The first to third pixel regions PXA-R, PXA-G, and PXA-B may all have an area of a same size, or at least one type of pixel region may have an area of a different size from the other types of pixel regions. The areas of the first to third pixel regions PXA-R, PXA-G, and PXA-B may be set according to the color of emitted light.

Referring to FIG. 4, the first to third pixel regions PXA-R, PXA-G, and PXA-B may have a rectangular shape in a plan view. However, the embodiment may not be limited thereto, and in a plan view, the first to third pixel regions PXA-R, PXA-G, and PXA-B may have any other polygonal shapes (including substantially polygonal shapes) such as a rhombus or a pentagon. The first to third pixel regions PXA-R, PXA-G, and PXA-B may have a rectangular shape (a substantially rectangular shape) having rounded corners in a plan view.

FIG. 4 shows, as an example, that the second pixel region PXA-G may be disposed in a first row, and the first pixel region PXA-R and the third pixel region PXA-B may be disposed in a second row, but the embodiment of the inventive concept may not be limited thereto, and the arrangement of the first to third pixel regions PXA-R, PXA-G, and PXA-B may be variously changed. For example, the first to third pixel regions PXA-R, PXA-G, and PXA-B may be arranged in a same row.

For example, the pixel regions PXA-R, PXA-G, and PXA-B may be arranged in the form of a stripe or may be arranged in the form of a PENTILE™ structure or a Diamond Pixel™ structure. However, the embodiment may not be limited thereto, and the order and arrangement that the pixel regions PXA-R, PXA-G, and PXA-B may be arranged come with varied combination according to display quality characteristics required for the display device DD (FIG. 1).

Figure 5:
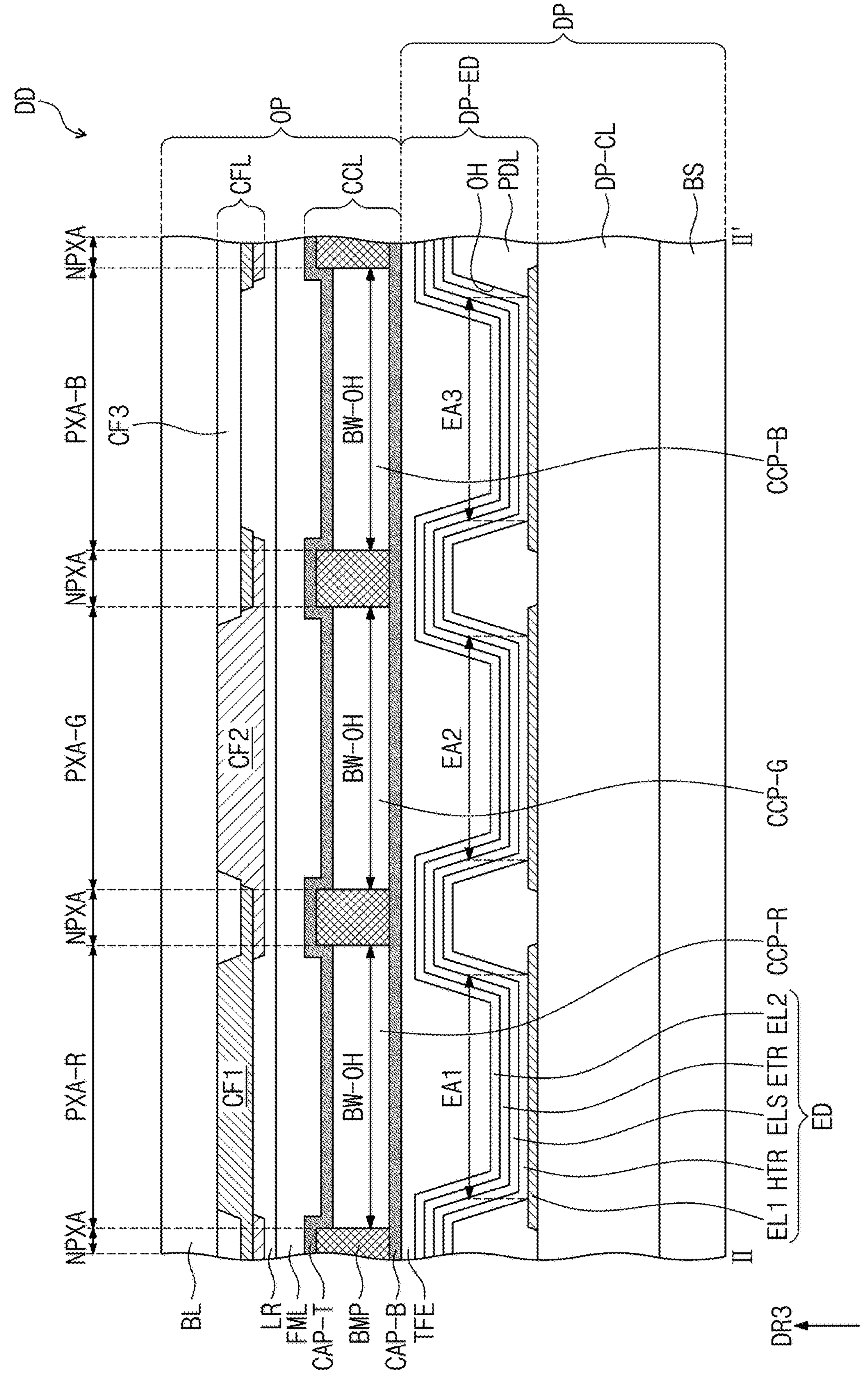
FIG. 5 is a schematic cross-sectional view of a display device according to an embodiment.

FIG. 5 is a schematic cross-sectional view showing a portion of the display device according to an embodiment. FIG. 5 may be a schematic cross-sectional view showing a portion corresponding to line II-II' of FIG. 4.

Referring to FIG. 5, in an embodiment, the display panel DP may include a base layer BS, a circuit layer DP-CL disposed on the base layer, and a display layer DP-ED disposed on the circuit layer DP-CL. The display layer DP-ED may include a pixel defining layer PDL, a light emitting element ED, and an encapsulation layer TFE. The encapsulation layer TFE may cover an upper portion of the light emitting element ED.

In the display device DD according to an embodiment, the display panel DP may be a light emitting display panel. For example, the display panel DP may be an organic electroluminescence display panel. In case that the display panel DP may be an organic electroluminescence display panel, the display layer DP-ED may include an organic electroluminescence element as the light emitting element ED. However, the embodiment of the inventive concept may not be limited thereto. For example, the display layer DP-ED may include a quantum dot light emitting element as the light emitting element ED. The display layer DP-ED may include a micro LED element and/or a nano LED element as the light emitting element ED.

The display panel DP may provide source light. The light emitting element ED may generate source light. The source light generated and emitted from the light emitting element ED may be provided to the light control panel OP, and at least a portion of the source light may be converted into light having a wavelength different from a wavelength of the source light in the light control layer CCL of the light control panel OP, or at least a portion of the source light may be transmitted without wavelength conversion.

In the display panel DP, the base layer BS may be a member providing a base surface in which the circuit layer DP-CL and the display layer DP-ED may be disposed. The base layer BS may be a glass substrate, a metal substrate, a polymer substrate, or the like. However, the embodiment of the inventive concept may not be limited thereto, and the base layer BS may be an inorganic layer, a functional layer, or a composite material layer.

The base layer BS may have a multilayer structure. For example, the base layer BS may have a three-layer structure of a polymer resin layer, an adhesive layer, and a polymer resin layer. In particular, the polymer resin layer may include a polyimide-based resin. The polymer resin layer may include at least one of an acrylic resin, a methacrylic resin, a polyisoprene-based resin, a vinyl-based resin, an epoxy-based resin, a urethane-based resin, a cellulose-based resin, a siloxane-based resin, a polyamide-based resin, or a perylene-based resin. As used herein, a "α-based" resin may be considered as including a functional group of "α".

The circuit layer DP-CL may be disposed on the base layer BS. The circuit layer DP-CL may include an insulating layer, a semiconductor pattern, a conductive pattern, a signal line, and the like. The insulating layer, the semiconductor layer, and the conductive layer may be formed on the base layer BS through coating or deposition, and subsequently, the insulating layer, the semiconductor layer, and the conductive layer may be selectively patterned through multiple times of a photolithography process. Then, the semiconductor pattern, the conductive pattern, and the signal line included in the circuit layer DP-CL may be formed. In an embodiment, the circuit layer DP-CL may include a transistor, a buffer layer, and multiple insulating layers. In an embodiment, the circuit layer DP-CL may include multiple transistors (not shown). The transistors (not shown) may each include a control electrode, an input electrode, and an output electrode. For example, the circuit layer DP-CL may include a switching transistor and a driving transistor for driving the light emitting element ED of the display layer DP-ED.

The display layer DP-ED may include the light emitting element ED as a display element. The light emitting element ED may generate source light. In an embodiment, the source light may include blue light and green light. In an embodiment, the source light may be white light which may include blue light, green light, and red light.

In an embodiment, the display layer DP-ED may include a light emitting element ED including a first electrode EL1, a second electrode EL2 facing the first electrode EL1, and a light emitting portion ELS disposed between the first electrode EL1 and the second electrode EL2. In an embodiment, the light emitting portion ELS may include an organic light emitting material, and the light emitting element ED may be an organic electroluminescent element. The light emitting element ED may further include a hole transport region HTR and an electron transport region ETR. Although not shown, the light emitting element ED may further include a capping layer (not shown) disposed on an upper portion of the second electrode EL2.

The display layer DP-ED may include the pixel defining layer PDL. The pixel defining layer PDL may be disposed on the circuit layer DP-CL and may cover a portion of the first electrode EL1. A light emitting opening OH may be defined in the pixel defining layer PDL. The light emitting opening OH of the pixel defining layer PDL may allow at least a portion of the first electrode EL1 to be exposed. In the embodiment, the light emitting regions EA1, EA2, and EA3 may be defined corresponding to a partial region of the first electrode EL1 exposed by the light emitting opening OH.

The pixel defining layer PDL may be formed of a polymer resin. For example, the pixel defining layer PDL may include a polyacrylate-based resin, a polyimide-based resin, or a combination thereof. The pixel defining layer PDL may be formed by further including an inorganic material in addition to the polymer resin. The pixel defining layer PDL may include a light absorbing material, or may include a black pigment or a black dye. The pixel defining layer PDL formed including a black pigment or a black dye may implement a black pixel defining layer. In case that forming the pixel defining layer PDL, carbon black may be used as a black pigment or a black dye, but the embodiment of the inventive concept may not be limited thereto.

The pixel defining layer PDL may be formed of an inorganic material. For example, the pixel defining layer PDL may be formed of silicon nitride ($SiN_x$), silicon oxide ($SiO_x$), silicon oxynitride ($SiO_xN_y$), the like, or a combination thereof.

The display panel DP may include a first light emitting region EA1, a second light emitting region EA2, and a third light emitting region EA3. The first light emitting region EA1, the second light emitting region EA2, and the third light emitting region EA3 may be regions divided by the pixel defining layer PDL. The first light emitting region EA1, the second light emitting region EA2, and the third light emitting region EA3 may respectively correspond to the first pixel region PXA-R, the second pixel region PXA-G, and the third pixel region PXA-B. As described herein, the term "correspond" indicates that two components overlap when viewed in the thickness direction DR3 (or a plan view) of the display panel DP, and this may not be limited to a same area.

The light emitting regions EA1, EA2, and EA3 may overlap the pixel regions PXA-R, PXA-G, and PXA-B respectively. In a plan view, the pixel regions PXA-R, PXA-G, and PXA-B separated by a division patterns BM P may have a greater area than the light emitting regions EA1, EA2, and EA3 separated by the pixel defining layer PDL.

In the light emitting element ED, the first electrode EL1 may be disposed on the circuit layer DP-CL. The first electrode EL1 may be exposed by the light emitting opening OH of the pixel defining layer PDL. The first electrode EL1 may be an anode or a cathode. The first electrode EL1 may be a pixel electrode. The first electrode EL1 may be a transmissive electrode, a transflective electrode, or a reflective electrode.

The second electrode EL2 may be disposed on the first electrode EL1. The second electrode EL2 may be a cathode or an anode. In an embodiment, in case that the first electrode EL1 may be an anode, the second electrode EL2 may be a cathode, and in case that the first electrode EL1 may be a cathode, the second electrode EL2 may be an anode. The second electrode EL2 may be a common electrode. However, the embodiment of the inventive concept may not be limited thereto. The second electrode EL2 may be a transmissive electrode, a transflective electrode, or a reflective electrode.

In an embodiment, the light emitting portion ELS may be provided as a single emission layer or as a light emitting stack in which multiple light emitting parts may be stacked on each other. In case that the light emitting portion ELS may be a light emitting stack in which multiple light emitting parts may be stacked on each other, the light emitting portion ELS may include two or more light emitting stacks that may be distinct from each other and stacked on each other in the third direction DR3, which may be a thickness direction. The light emitting portions may each include at least one emission layer.

For example, in an embodiment, the light emitting portion ELS may include at least one blue light emitting unit that emits blue light and at least one green light emitting unit that emits green light. The light emitting portion ELS may include a charge generation layer disposed between the light emitting parts. The embodiment of the inventive concept may not be limited thereto, and the light emitting portion ELS may include a blue light emitting unit that emits blue light, a green light emitting unit that emits green light, and a red light emitting unit that emits red light.

The emission layer included in the light emitting portion ELS may have a single layer formed of a single material, a single layer formed of multiple materials different from each other, or a multi-layered structure that has multiple layers formed of multiple materials different from each other. The emission layer may include a fluorescent or phosphorescent material. In the light emitting element ED according to an embodiment, the light emitting portion ELS may include an organic light emitting material, an organometallic complex, or quantum dots as a light emitting material.

The light emitting portion ELS may be commonly disposed in the first to third light emitting regions EA1, EA2, and EA3 and a non-light emitting region. Herein, the non-light emitting region may be a portion that overlaps the pixel defining layer PDL. However, the embodiment of the inventive concept may not be limited thereto, and in an embodiment, the light emitting portion ELS may be disposed in the light emitting opening OH. The light emitting portion ELS may be separately disposed to correspond to each of the light emitting regions EA1, EA2, and EA3 which may be separated by the pixel defining layer PDL.

In the light emitting element ED, the hole transport region HTR may be disposed on the first electrode EL1. The hole transport region HTR may be commonly disposed in the first to third light emitting regions EA1, EA2, and EA3 and the non-light emitting region. In an embodiment, the hole transport region HTR may be a common layer and may be disposed to overlap multiple pixel parts PXU of the display region DA shown in FIG. 4. However, the embodiment of the inventive concept may not be limited thereto, and the hole transport region HTR may be disposed separately to correspond to each of the first to third light emitting regions EA1, EA2, and EA3. The hole transport region HTR may include at least one of a hole transport layer, a hole injection layer, or an electron blocking layer.

The electron transport region ETR may be disposed on the light emitting portion ELS. The electron transport region ETR may include at least one of an electron injection layer, an electron transport layer, or a hole blocking layer. The electron transport region ETR may be commonly disposed in the first to third light emitting regions EA1, EA2, and EA3 and the non-light emitting region. However, the embodiment of the inventive concept may not be limited thereto, and the electron transport region ETR may be disposed separately to correspond to each of the first to third light emitting regions EA1, EA2, and EA3.

The encapsulation layer TFE may be disposed on the second electrode EL2. For example, in case that the light emitting element ED includes a capping layer (not shown), the encapsulation layer TFE may be disposed on the capping layer (not shown). The encapsulation layer TFE may cover the light emitting element ED.

The encapsulation layer TFE may be a thin film encapsulation layer. The encapsulation layer TFE may be a single layer or a laminated layer of multiple layers. The encapsulation layer TFE may include at least one insulating layer. The encapsulation layer TFE according to an embodiment may include at least one inorganic film (hereinafter, an encapsulation inorganic film). The encapsulation layer TFE according to an embodiment may include at least one organic film (hereinafter, an encapsulation organic film) and at least one encapsulation inorganic film.

The encapsulation inorganic film protects the light emitting element ED from moisture/oxygen, and the encapsulation organic film protects the light emitting element ED from foreign material such as dust particles. The encapsulation inorganic film may include silicon nitride, silicon oxynitride, silicon oxide, titanium oxide, aluminum oxide, the like, or a combination thereof but may not be particularly limited thereto. The encapsulation organic film may include an acrylic compound, an epoxy-based compound, the like, or a combination thereof. The encapsulation organic film may include a photopolymerizable organic material, and may not be particularly limited.

The light control panel OP may be disposed on the display panel DP. In the display device DD of an embodiment shown in FIG. 5, the light control panel OP may be disposed (e.g., directly disposed) on the display panel DP. However, the embodiment of the inventive concept may not be limited thereto, and the display device DD may include a filling layer (not shown) disposed between the display panel DP, which may be the lower panel, and the light control panel OP, which may be the upper panel, as described above.

In an embodiment, the light control panel OP may include a light control layer CCL. In an embodiment shown in FIG. 5, the light control layer CCL may be disposed on the encapsulation layer TFE. In an embodiment, the light control panel OP may include a buffer layer FML, a low refractive layer LR, a color filter layer CFL, and a base substrate BL, in addition to the light control layer CCL.

In an embodiment, the light control layer CCL may include quantum dots. The light control layer CCL may include multiple light control portions CCP-R, CCP-G, and CCP-B. At least one of the first to third light control portions CCP-R, CCP-G, and CCP-B may include quantum dots that convert the optical properties of source light.

The light control layer CCL may include a division pattern BMP. The division pattern BMP may be configured to distinguish between multiple light control portions CCP-R, CCP-G, and CCP-B. The division pattern BMP may include a base resin and an additive. The base resin may be formed of various resin compositions that may be generally referred to as binders. The additive may include a coupling agent and/or a photo-initiator. The additive may further include a dispersant.

The division pattern BMP may include a black coloring agent to block light. The division pattern BMP may include a black dye and a black pigment mixed with a base resin. In an embodiment, the black coloring agent may include carbon black, a metal such as chromium, or an oxide thereof.

An opening BW-OH corresponding to the light emitting opening OH may be defined in the division pattern BMP. In a plan view, the opening BW-OH may overlap the light emitting opening OH and may have a larger area than the light emitting opening OH. The opening BW-OH may have a larger area than the light emitting regions EA1, EA2, and EA3 defined by the light emitting opening OH. The light control portions CCP-R, CCP-G, and CCP-B may be disposed inside the opening BW-OH.

In an embodiment, the light control layer CCL may include a first light control portion CCP-R corresponding to the first pixel region PXA-R, a second light control portion CCP-G corresponding to the second pixel region PXA-G, and a third light control portion CCP-B corresponding to the third pixel region PXA-B. The first light control portion CCP-R may be a red light control portion that emits red light, and the second light control portion CCP-G may be a green light control portion that emits green light. The third light control portion CCP-B may be a blue light control portion that emits blue light. For example, the third light control portion CCP-B may be a transmission light control portion that transmits and emits source light.

The first light control portion CCP-R wavelength-converts the source light provided from the display layer DP-ED to emit red light. A portion of the source light may be emitted by passing through the first light control portion CCP-R without being wavelength-converted. The second light control portion CCP-G wavelength-converts the source light provided from the display layer DP-ED to emit green light. A portion of the source light may be emitted by passing through the second light control portion CCP-G without being wavelength-converted. In an embodiment, the first light control portion CCP-R and the second light control portion CCP-G may include quantum dots that wavelength-convert at least a portion of the source light.

In an embodiment, the third light control portion CCP-B may not include quantum dots. However, the embodiment of the inventive concept may not be limited thereto, and the third light control portion CCP-B may also include quantum dots, and the third light control portion CCP-B may emit light in a different wavelength range from the first light control portion CCP-R and the second light control portion CCP-G.

In a light control panel OP according to an embodiment shown in FIG. 5, the base substrate BL may be a member that provides a reference surface on which the color filter layer CFL, the low refractive layer LR, and the light control layer CCL may be disposed. The base substrate BL may be a glass substrate, a metal substrate, a plastic substrate, and the like. However, the embodiment of the inventive concept may not be limited thereto, and the base substrate BL may be an inorganic layer, an organic layer, or a composite material layer. Unlike what is shown, the base substrate BL may be omitted in an embodiment.

Although not shown, an anti-reflection layer may be disposed on the base substrate BL. The anti-reflection layer may be a layer that reduces the reflectance of external light incident from the outside. The anti-reflection layer may be a layer that selectively transmits light emitted from the display device DD. In an embodiment, the anti-reflection layer may be a single layer including a dye and/or a pigment dispersed in a base resin. The anti-reflection layer may be provided as a single continuous layer that may entirely overlap the first to third pixel regions PXA-R, PXA-G, and PXA-B.

The anti-reflection layer may not include a polarizing layer. Accordingly, light that passes through the anti-reflection layer and may be incident on the side of the display layer DP-ED may be unpolarized light. The display layer DP-ED may receive unpolarized light from an upper portion of the anti-reflection layer.

In an embodiment, the light control layer CCL may include barrier layers CAP-B and CAP-T. The barrier layers CAP-B and CAP-T may serve to prevent penetration of moisture and/or oxygen (hereinafter, referred to as 'moisture/oxygen') and improve optical properties of the light control panel OP by regulating a refractive index. The barrier layers CAP-B and CAP-T may be disposed on an upper portion or a lower portion of the light control layer CCL. The barrier layers CAP-B and CAP-T may be disposed on the upper or lower surface of the light control portions CCP-R, CCP-G, and CCP-B to prevent the light control portions CCP-R, CCP-G, and CCP-B from being exposed to moisture/oxygen, and in particular, may prevent quantum dots included in the light control portions CCP-R, CCP-G, and CCP-B from being exposed to moisture/oxygen. The barrier layers CAP-B and CAP-T may also protect the light control portions CCP-R, CCP-G, and CCP-B from external shock.

In an embodiment, the first barrier layer CAP-T may be disposed to be spaced apart from the display layer DP-ED with the light control portions CCP-R, CCP-G, and CCP-B therebetween. The first barrier layer CAP-T may be disposed on the upper surface of the light control portions CCP-R, CCP-G, and CCP-B. In an embodiment, the light control layer CCL may further include a second barrier layer CAP-B disposed between the light control portions CCP-R, CCP-G, and CCP-B and the display layer DP-ED. In an embodiment, the first barrier layer CAP-T may cover the upper surface of the light control portions CCP-R, CCP-G, and CCP-B adjacent to the low refractive layer LR, and the second barrier layer CAP-B may cover the lower surface of the light control portions CCP-R, CCP-G, and CCP-B adjacent to the display layer DP-ED. As used herein, the "upper surface" may be a surface placed on an upper portion with respect to the third direction DR3, and the "lower surface" may be a surface placed on a lower portion with respect to the third direction DR3.

The first barrier layer CAP-T and the second barrier layer CAP-B may cover the light control portions CCP-R, CCP-G, and CCP-B and a side of the division pattern BMP.

The first barrier layer CAP-T may cover a surface of the division pattern BM P and the light control portions CCP-R, CCP-G, and CCP-B, which may be adjacent to the low refractive layer LR. The first barrier layer CAP-T may be disposed to follow a step between the division pattern BM P and the light control portions CCP-R, CCP-G, and CCP-B.

The first barrier layer CAP-T and the second barrier layer CAP-B may include an inorganic material. In an embodiment, the first barrier layer CAP-T may include silicon oxynitride ($SiO_xN_y$). Both the first barrier layer CAP-T and the second barrier layer CAP-B may include silicon oxynitride. However, the embodiment of the inventive concept may not be limited thereto, and the first barrier layer CAP-T may include silicon oxynitride, and the second barrier layer CAP-B may include silicon oxide ($SiO_x$).

The light control panel OP may further include a color filter layer CFL disposed on the light control layer CCL. The color filter layer CFL may include at least one of the color filters CF1, CF2, and CF3. The color filter transmits light having a specific wavelength range and blocks light having a wavelength other than the specific wavelength range. In an embodiment, the first color filter CF1 may be a red filter that transmits red light, the second color filter CF2 may be a green filter that transmits green light, and the third color filter CF3 may be a blue filter that transmits blue light.

The filters CF1, CF2, and CF3 each include a polymer photosensitive resin and a colorant. The colorant may include pigments, dyes, or a combination thereof. The first color filter CF1 may contain a red pigment or a red dye, the second color filter CF2 may contain a green pigment or a green dye, and the third color filter CF3 may contain a blue pigment or a blue dye. In an embodiment, the third color filter CF3 may not contain pigments or dyes.

The first to third color filters CF1, CF2, and CF3 may be disposed to correspond to the first pixel region PXA-R, the second pixel region PXA-G, and the third pixel region PXA-B, respectively. The first to third color filters CF1, CF2, and CF3 may be disposed to overlap the first to third light control portions CCP-R, CCP-G, and CCP-B, respectively.

Referring to FIG. 5, corresponding to the peripheral region NPXA, the color filters CF1, CF2, and CF3 that transmit different light may be disposed to overlap each other. Corresponding to the peripheral region NPXA, the color filters CF1, CF2, and CF3 may be disposed to overlap each other in the third direction DR3, which may be the thickness direction, to distinguish a border between the adjacent pixel regions PXA-R, PXA-G, and PXA-B. Unlike what is shown, the color filter layer CFL may include a light blocking portion (not shown) for distinguishing a border between the adjacent color filters CF1, CF2, and CF3. The light blocking portion (not shown) may be formed of a blue filter or may include an organic light blocking material or an inorganic light blocking material that may include a black pigment or a black dye.

Referring to FIG. 5, the light control panel OP may further include a low refractive layer LR. The low refractive layer LR may be disposed between the light control layer CCL and the color filters CF1, CF2, and CF3. The low refractive layer LR may serve as an optical functional layer that may be disposed between the light control portions CCP-R, CCP-G, and CCP-B and the color filters CF1, CF2, and CF3 respectively to increase light extraction efficiency of light emitted from the light control layer CCL or prevent reflected light from being incident on the light control layer CCL. The low refractive layer LR may have a smaller refractive index than a layer adjacent thereto.

The low refractive layer LR may include at least one inorganic layer. For example, the low refractive layer LR may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, a thin metal film, or a combination thereof in which light transmittance may be secured, etc. However, the embodiment of the inventive concept may not be limited thereto, and the low refractive layer LR may include an organic layer. The low refractive layer LR may have, for example, a structure in which multiple hollow particles may be dispersed in an organic polymer resin. The low refractive layer LR may be formed of a single layer or of multiple layers.

In an embodiment, the light control panel OP may further include a buffer layer FML. In an embodiment, the buffer layer FML may fill a space between the light control layer CCL and the color filter layer CFL.

The buffer layer FML may serve as a buffer between the light control layer CCL and the color filter layer CFL. In an embodiment, the buffer layer FML may have a shock absorbing function, and the like, and may increase the strength of the display device DD. The buffer layer FML may serve as a protective layer that protects the light control layer CCL.

The buffer layer FML may be formed from a filler resin including a polymer resin. For example, the buffer layer FML may be formed from a filling layer resin including an acrylate-based resin, an epoxy-based resin, or a combination thereof. Unlike what may be described above, the buffer layer FML may be an inorganic material layer including at least one inorganic material among silicon nitride, silicon oxide, and silicon oxynitride. The buffer layer FML may be formed of a single layer or multiple layers. In an embodiment, the buffer layer FML may not be provided, and the color filter layer CFL may be disposed (e.g., directly disposed) on the light control layer CCL.

Figure 6:
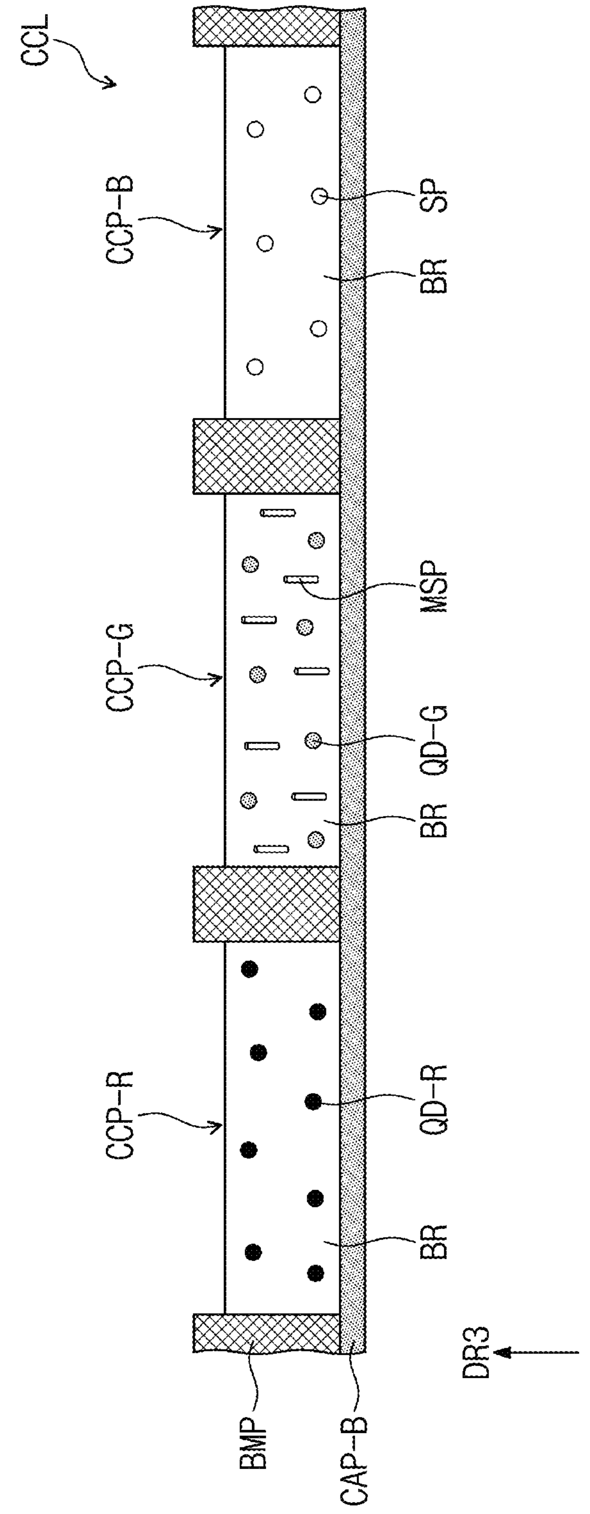
FIG. 6 is a schematic cross-sectional view of a light control layer according to an embodiment.

FIG. 6 is a schematic cross-sectional view showing a portion of the light control layer according to an embodiment. The light control layer CCL of an embodiment may include a first light control portion CCP-R, a second light control portion CCP-G, and a third light control portion CCP-B, which may be separated by the division pattern BMP.

The second light control portion CCP-G corresponding to the second pixel region PXA-G (FIG. 5), which may be a green pixel region, may include first quantum dots QD-G and modified scatterers MSP. The second light control portion CCP-G may include a base resin portion BR, and the first quantum dots QD-G and the modified scatterers MSP may be dispersed and disposed in the base resin portion BR.

The first quantum dots QD-G may convert the optical properties of at least a portion of the source light provided from the display layer DP-ED (FIG. 5). For example, the first quantum dots QD-G may convert light in the blue wavelength range of the source light into green light. The first quantum dots QD-G, which converts the wavelength of the provided light to emit green light, may be referred to as green quantum dots.

The second light control portion CCP-G may also include multiple modified scatterers MSP. The modified scatterers MSP may each have a rod-like shape. The modified scatterers MSP may each be aligned in parallel in the third direction DR3, which may be the thickness direction of the second light control portion CCP-G to be included. The modified scatterers MSP may each have a rectangular shape in which a length of a long side may be greater than a length of a short side on a cross-section perpendicular to an upper surface of the display layer DP-ED (FIG. 5). A cross-section perpendicular to the upper surface of the display layer DP-ED (FIG. 5) may be a plane parallel to the third direction DR3, which may be the thickness direction of the light control layer CCL. For example, the cross-section perpendicular to the upper surface of the display layer DP-ED (FIG. 5) may be a plane defined by the first directional axis DR1 (FIG. 1) and the third directional axis DR3 (FIG. 1) or a plane defined by the second directional axis DR2 (FIG. 1) and the third directional axis DR3 (FIG. 1).

Figure 7A:
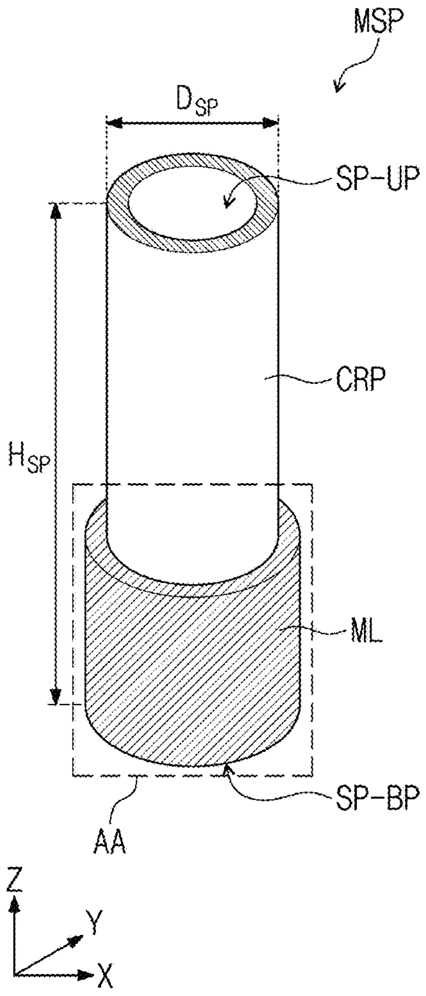
FIG. 7A is a perspective view of conversion scatterers according to an embodiment.
Figure 7B:
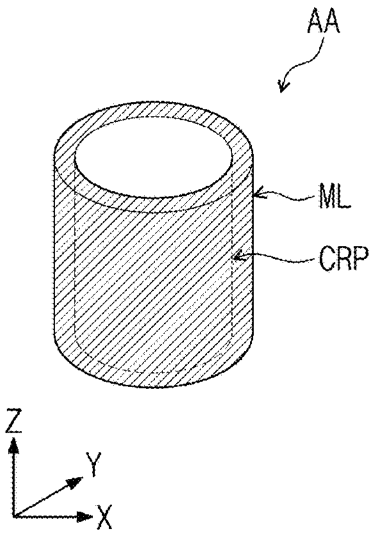
FIG. 7B is a view showing a portion of conversion scatterers according to an embodiment.

FIGS. 7A and 7B are each schematic cross-sectional views showing modified scatterers according to an embodiment as an example. FIG. 7A is a perspective view showing modified scatterers according to an embodiment, and FIG. 7B is a view enlarging a region of AA of FIG. 7A.

In an embodiment, the modified scatterers MSP may include a core portion CRP and a metal coating portion ML. The core portion CRP of the modified scatterers MSP may have a rod-like shape. The metal coating portion ML may cover an end of the core portion CRP. The metal coating portion ML may surround an upper portion or a lower portion of the core portion CRP. The metal coating portion ML may be provided to cover a side, which may be an upper surface SP-UP or a lower surface SP-BP of the core portion CRP and a side surface extending from the covered surface. In FIGS. 7A and 7B, the metal coating portion ML is shown to be disposed surrounding the lower surface SP-BP, which may be an end of the core portion CRP, but the embodiment of the inventive concept may not be limited thereto, and the metal coating portion ML may be disposed surrounding the upper surface SP-UP instead of the lower surface SP-BP.

The metal coating portion ML may be disposed to surround an end of the core portion CRP, and the metal coating portion ML may not be provided on another end and the core portion CRP may be exposed. A length of the core portion CRP surrounded by the metal coating portion ML in a Z-axis direction (Z) may be ½ or less of a length ($H_{SP}$) of the entire core portion CRP in the Z-axis direction (Z). The metal coating portion ML may be provided lopsided toward a side of the core portion CRP constituting the modified scatterers MSP, and accordingly, in a method for manufacturing a display device of an embodiment which will be described later, the modified scatterers MSP may be readily arranged. The modified scatterers MSP may be arranged in a desired alignment direction using a magnetic field or the like depending on the presence or absence of the metal material by distinguishing between a portion coated with the metal material and a portion not coated.

Referring to FIGS. 7A and 7B, in an embodiment, in the modified scatterers MSP, a length ($H_{SP}$) in the Z-axis direction (Z) which may be the long side direction may be 1.5 times or greater than a length ($D_{SP}$) in the X-axis direction (X) which may be the short side direction. The length of the modified scatterers MSP in the long side direction may correspond to the length of the core portion CRP in the long side direction, and the length of the modified scatterers MSP in the short side direction may correspond to the length of the core portion CRP in the short side direction.

For example, the length ($H_{SP}$) of the core portion CRP in the Z-axis direction (Z) may be about 1.5 to about 10 times the length ($D_{SP}$) in the X-axis direction (X). To be specific, the length ($H_{SP}$) of the core portion CRP in the Z-axis direction (Z) may be in a range of about 2 to about 10 times the length ($D_{SP}$) in the X-axis direction (X).

The X-axis, Y-axis, and Z-axis shown in FIG. 7A and subsequent drawings may be relative directions, and a direction in which the X-axis extends and a direction in which the Y-axis extends may be perpendicular to each other, and a direction in which the Z-axis extends may be a normal direction to a plane defined by the X-axis and Y-axis. Herein, the Z-axis direction (Z) may be described as a direction parallel to the third direction DR3, but the embodiment of the inventive concept may not be limited thereto. The Z-axis direction Z may be the same as or opposite to the direction in which the third direction DR3 extends.

The modified scatterers MSP may have a cylindrical shape. For example, the modified scatterers MSP may have a circular cross-section having a diameter corresponding to the length ($D_{SP}$) in the X-axis direction (X), and have a cylindrical shape having a height corresponding to the length ($H_{SP}$) in the Z-axis direction (Z). However, the embodiment of the inventive concept may not be limited thereto, and the modified scatterers MSP may have an elliptical pillar shape having an elliptical cross-section parallel to the plane defined by the X-axis and Y-axis. Unlike what is described above, on a cross-section parallel to the plane defined by the X-axis and Y-axis, the modified scatterers MSP may be used without limitation in case that the modified scatterers MSP may have a three-dimensional shape having a cross-section in which the length ($H_{SP}$) in the Z-axis direction (Z), which may be the long side direction, may be 1.5 times or greater than the length ($D_{SP}$) in the X-axis direction (X), which may be the short side direction.

In an embodiment, the modified scatterers MSP have the length ($H_{SP}$) in the long side direction (Z) which may be 1.5 times or greater than the length ($D_{SP}$) in the short side direction, and may thus have anisotropy in the three-dimensional shape. Accordingly, in case that the modified scatterers MSP are included in the second light control portion CCP-G (FIG. 6), a light emission path may be adjusted by the modified scatterers MSP. The path of light emitted after being incident on the second light control portion CCP-G (FIG. 6) may be adjusted according to the arrangement direction of the modified scatterers MSP having anisotropy in the three-dimensional shape. In an embodiment, the modified scatterers MSP may guide light to be emitted in the third direction DR3 (FIG. 6), which may be an upper surface direction of the second light control portion CCP-G (FIG. 6), and may thus increase front surface light extraction in the second light control portion CCP-G (FIG. 6).

In an embodiment, in case that the length ($H_{SP}$) in the Z-axis direction (Z), which may be the long side direction of the modified scatterers MSP, may be less than 1.5 times the length ($D_{SP}$) in the X-axis direction (X) which may be the short side direction, the modified scatterers MSP may not have steric anisotropy and the direction of light scattered by the modified scatterers MSP does not have a main direction, and accordingly, the light path may not be adjusted by the modified scatterers MSP.

In each of the modified scatterers MSP, the length ($H_{SP}$) in the long side direction may be in a range of about 50 nm to about 500 nm, and the length ($D_{SP}$) in the short side direction may be in a range of about 20 nm to about 200 nm. The modified scatterers MSP may be provided to have a numerical range of the length ($H_{SP}$) in the long side direction and the length ($D_{SP}$) in the short side direction in a range where the length ($H_{SP}$) in the long side direction may be about 1.5 times or greater than the length ($D_{SP}$) in the short side direction.

For example, in an embodiment, the length ($H_{SP}$) in the long side direction may be about 180 nm or greater, and the length ($D_{SP}$) in the short side direction may be about 100 nm or less. However, the embodiment of the inventive concept may not be limited thereto.

The core portion CRP of the modified scatterers MSP may include $TiO_2$, $SiO_2$, $BaSO_4$, ZnO, $Al_2O_3$, $CaCO_3$, or a combination thereof. The metal coating portion ML of the modified scatterers MSP may include Al, Cu, or a combination thereof. For example, in an embodiment, the core portion CRP of the modified scatterers MSP may be a rod-like $TiO_2$ particle, and the metal coating portion ML may be an Al coating layer. However, the embodiment of the inventive concept may not be limited thereto, and the materials of the core portion CRP and the materials of the metal coating portion ML described above may be combined.

Referring back to FIG. 6, the light control layer CCL may include a first light control portion CCP-R corresponding to the first pixel region PXA-R which may be a red pixel region. The first light control portion CCP-R may include second quantum dots QD-R. The first light control portion CCP-R may include a base resin portion BR, and the second quantum dots QD-R may be dispersed and disposed in the base resin portion BR. The second quantum dots QD-R may convert the optical properties of at least a portion of the source light provided from the display layer DP-ED (FIG. 5). The second quantum dots QD-R may be different from the first quantum dots QD-G. For example, the second quantum dots QD-R may convert light in the blue wavelength range of the source light into red light. The second quantum dots QD-R, which may convert the wavelength of the provided light to emit red light may be referred to as red quantum dots. In an embodiment, a portion of the second quantum dots QD-R may convert light in the green wavelength range of the source light into red light.

The light control layer CCL may include a third light control portion CCP-B corresponding to the third pixel region PXA-B. The third light control portion CCP-B may be a portion that transmits and emits source light provided from the display layer DP-ED (FIG. 5). The third light control portion CCP-B may include a base resin portion BR, and may also include scatterers SP dispersed in the base resin portion BR. The third light control portion CCP-B may not include quantum dots. However, the embodiment of the inventive concept may not be limited thereto, and may further include quantum dots that emit blue light by wavelength-converting a portion of the source light provided from the display layer DP-ED (FIG. 5).

The scatterers SP included in the third light control portion CCP-B may have a spherical shape. The scatterers SP having a spherical shape may uniformly scatter the light incident on the third light control portion CCP-B so that the light may be transmitted and emitted. The scatterers SP may be inorganic particles. For example, the scatterers SP may include at least one among $TiO_2$, ZnO, $Al_2O_3$, $SiO_2$, and hollow silica. The scatterers SP may include any one among $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica.

In the first to third light control portions CCP-R, CCP-G, and CCP-B, the base resin portion BR may be a medium in which the quantum dots QD-R and QD-G, the modified scatterers MSP, or the scatterers SP may be dispersed, and may be formed of various resin compositions that may be generally referred to as binders. For example, the base resin portion BR may be an acrylate-based resin portion, a urethane-based resin portion, a silicone-based resin portion, an epoxy-based resin portion, or a combination thereof. The base resin portion BR included in the first to third light control portions CCP-R, CCP-G, and CCP-B may all be the same, or a base resin portion of at least one light control portion may be different from a base resin portion of the other light control portions.

Quantum dots included in the light control layer CCL of an embodiment may include crystals of a semiconductor compound. The descriptions of quantum dots, which will be described later may also apply to the first quantum dots QD-G and the second quantum dots QD-R.

The quantum dots may emit light of various emission wavelengths depending on the size of the crystal. The quantum dots may emit light of various emission wavelengths by regulating an element ratio in the quantum dots compound.

Each quantum dot may have a diameter in a range of about 1 nm to about 10 nm. The quantum dots may be synthesized through a wet chemical process, a metal organic chemical vapor deposition process, a molecular beam epitaxy process, or a process similar thereto.

Among the quantum dot manufacturing processes, the wet chemical process may be a method of mixing an organic solvent and a precursor material and growing a quantum dot particle crystal. In case that the quantum dot particle crystal grows, the organic solvent naturally serves as a dispersant coordinated to a surface of the quantum dot crystal and may control the growth of the particle crystal. Therefore, the wet chemical process may be easier than vapor deposition methods such as metal organic chemical vapor deposition (MOCVD) or molecular beam epitaxy (MBE), and may control the growth of quantum dot particles through a low-cost process.

A core of the quantum dot may be selected from a Group II-VI compound, a Group III-V compound, a Group III-VI compound, a Group I-III-VI compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, and a mixture thereof. The Group II-VI semiconductor compound may further include a Group I metal and/or a Group IV element. The Group I-II-VI compound may be selected from CuZnS and the like, and the Group II-IV-VI compound may be selected from ZnSnS and the like. The Group I-II-IV-VI compound may be selected from quaternary compounds selected from the group consisting of $Cu_2ZnSnS_2$, $Cu_2ZnSnS_4$, $Cu_2ZnSnSe_4$, $Ag_2ZnSnS_2$, and a mixture thereof.

The Group III-VI compound may include a binary compound such as $In_2S_3$ and $In_2Se_3$, a ternary compound such as $InGaS_3$ and $InGaSe_3$, or any combination thereof.

The Group I-III-VI compound may be selected from a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$, or a mixture thereof, or a quaternary compound such as $AgInGaS_2$ and $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compound may further include a Group II metal. For example, InZnP and the like may be selected as a Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof.

Examples of the Group II-IV-V semiconductor compound may be a ternary compound selected from the group consisting of ZnSnP, $ZnSnP_2$, $ZnSnAs_2$, $ZnGeP_2$, $ZnGeAs_2$, $CdSnP_2$, and $CdGeP_2$ and a mixture thereof.

The Group IV element may be selected from the group consisting of Si, Ge, and a mixture thereof. The Group IV compound may be a binary compound selected from the group consisting of SiC, SiGe, and a mixture thereof.

Each element included in the multi-element compound such as the binary compound, ternary compound, and quaternary compound may be present in particles at a uniform concentration or a non-uniform concentration. A formula representing quantum dots may indicate the types of elements included in a compound, and element ratios in the compound may be different. For example, $AgInGaS_2$ may indicate $AgIn_xGa_{1-x}S_2$ (x may be a real number between 0 and 1).

The binary compound, the ternary compound, or the quaternary compound may be present in particles having a uniform concentration distribution, or may be present in the same particles having a partially different concentration distribution. A core/shell structure in which one quantum dot surrounds another quantum dot may be present. The core/shell structure may have a concentration gradient in which the concentration of an element present in the shell becomes lower towards the core.

In some embodiments, a quantum dot may have the core/shell structure including a core having nano-crystals, and a shell surrounding the core, which may be described above. The shell of the quantum dot may serve as a protection layer to prevent the chemical deformation of the core to maintain semiconductor properties, and/or a charging layer to impart electrophoresis properties to the quantum dot. The shell may be a single layer or multiple layers. Examples of the shell of the quantum dot may be a metal or non-metal oxide, a semiconductor compound, or a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, or a ternary compound such as $MgAl_2O_4$, $CoFe_2O_4$, $NiFe_2O_4$, and $CoMn_2O_4$, but the embodiment of the inventive concept may not be limited thereto.

The semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the embodiment of the inventive concept may not be limited thereto.

The quantum dot may have, in an emission wavelength spectrum, a full width of half maximum (FWHM) of about 45 nm or less, preferably about 40 nm or less, and more preferably about 30 nm or less, and in this range, the color purity or the color reproducibility may be improved. Light emitted through the quantum dot may be emitted in all directions, and thus a wide viewing angle may be improved.

The form of a quantum dot may not be particularly limited as long as it may be a form commonly used in the art, but more specifically, a quantum dot in the form of spherical, pyramidal, multi-arm, or cubic nanoparticles, nanotubes, nanowires, nanofibers, nanoplatelets, and the like may be used.

As the size of the quantum dot or the ratio of elements in the quantum dot compound may be regulated, the energy band gap may be accordingly controlled to obtain light of various wavelengths from a layer containing quantum dots. Therefore, by using the quantum dots as described above (using quantum dots of different sizes or having different element ratios in the quantum dot compound), a light control portion emitting light of various wavelengths may be obtained.

In an embodiment, the display device of an embodiment described with reference to FIGS. 5 to 7B may include modified quantum dots whose long side may be aligned in parallel with a thickness direction of the light control portion in at least one light control portion of the light control layer to have an increased amount of light emitted from the display layer through the light control portion, and may thus exhibit improved luminance characteristics. The source light generated in the display layer of the display device of an embodiment and provided to the light control layer may be light of mixed two colors each having a blue wavelength and a green wavelength as the maximum central wavelength. For example, the source light generated in the display layer of the display device of an embodiment and provided to the light control layer may be light of mixed three colors each having a blue wavelength, a green wavelength, and a red wavelength as the maximum central wavelength.

Figure 8A:
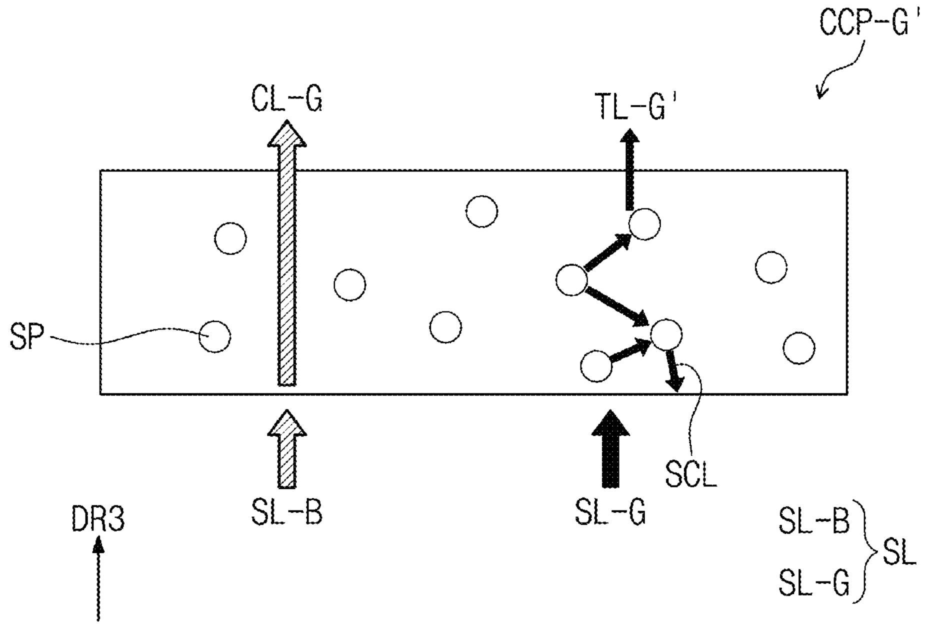
FIG. 8A is a view showing the form of light emission from a typical light control portion including typical scatterers as an example.
Figure 8B:
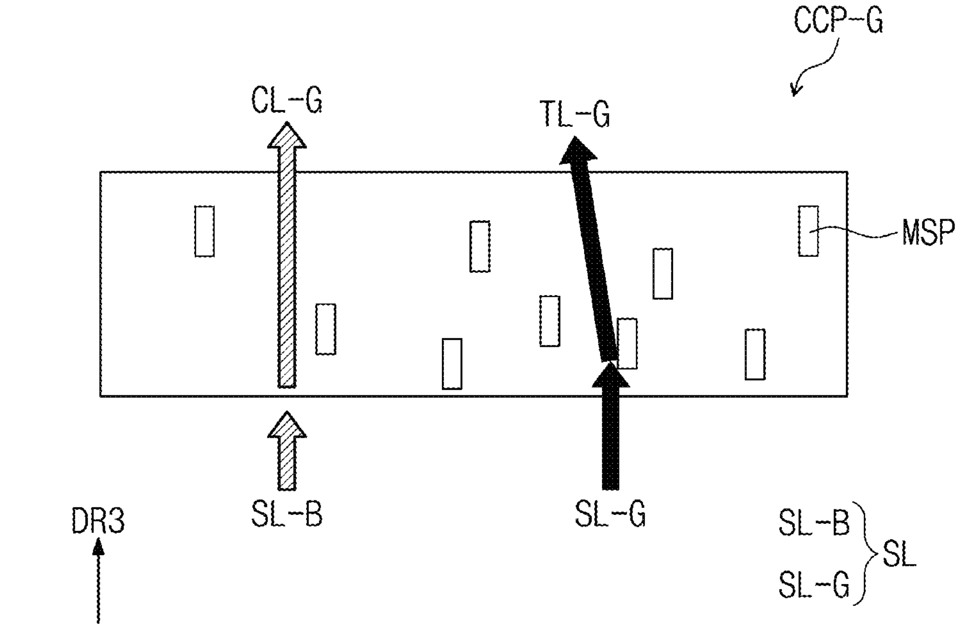
FIG. 8B is a view showing the form of light emission from a light control portion according to an embodiment as an example.

FIG. 8A is a view showing a light path in a typical light control portion, and FIG. 8B is a view showing a light path in the light control portion according to an embodiment. The light control portions CCP-G' and CCP-G shown in FIGS. 8A and 8B each correspond to the green light control portions, and the quantum dot composition in the light control portions CCP-G' and CCP-G may not be provided.

Source light SL provided to the light control portions CCP-G' and CCP-G shown in FIGS. 8A and 8B respectively may be light in an optical spectrum having two peaks with different central wavelengths. For example, the source light SL may include blue light SL-B having a peak in the blue wavelength range and green light SL-G having a peak in the green wavelength range.

The scatterers SP included in the typical light control portion CCP-G' may have a spherical shape. Among the source light SL incident on the typical light control portion CCP-G', the blue light SL-B may be wavelength-converted in the light control portion CCP-G' and emitted as converted green light CL-G. Among the source light SL incident on the typical light control portion CCP-G', the green light SL-G may be scattered by the scatterer SP and a portion thereof passes through the light control portion CCP-G', and may thus be emitted as transmitted green light TL-G'. Among the incident green light SL-G, some light SCL that may not be emitted in the third direction DR3, which may be an upper direction of the light control portion CCP-G', may be scattered internally and disappear, or may be emitted in a direction other than the light extraction direction. Accordingly, only a portion of the incident green light SL-G may be emitted as the transmitted green light TL-G'. This indicates that the spherical scatterers SP included in the typical light control portion CCP-G' scatter incident light in all directions, and accordingly, the green-light SL-G incident in the third direction DR3 may not be only emitted in the third direction DR3 but may be also scattered and directed to a side surface or a lower surface. Accordingly, the proportion of transmitted green light TL-G' transmitted and directed to the front surface out of the incident green light SL-G may be significantly reduced.

In comparison, the light control portion CCP-G of an embodiment shown in FIG. 8B may include the above-described modified scatterers MSP, and the modified scatterers MSP may be arranged and included such that the long side of the modified scatterers MSP may be parallel in the third direction DR3, which may be the thickness direction of the light control portion CCP-G.

Among the source light SL incident on the light control portion CCP-G of an embodiment, the blue light SL-B may be wavelength-converted in the light control portion CCP-G and emitted as converted green light CL-G. Among the source light SL incident on the light control portion CCP-G of an embodiment, the green light SL-G may have a light path partially modified by the modified scatterers MSP, but the proportion of transmitted green light TL-G emitted in the front surface direction as compared to the typical light control portion CCP-G' may increase.

Unlike the spherical scatterers SP, the modified scatterers MSP may have steric anisotropy in which a length in a direction (e.g., the third direction DR3) may be greater than a length in another direction perpendicular thereto, and may thus adjust the path of the incident green light SL-G. In an embodiment, in case that the direction in which the long side direction of modified scatterers MSP having steric anisotropy is aligned may be parallel to the direction in which the source light SL may be provided, light scattering by the modified scatterers MSP may be minimized, and the green light SL-G may transmit between the modified scatterers MSP without interference, and accordingly, the proportion of transmitted green light TL-G emitted from the front surface direction increases.

Figure 9:
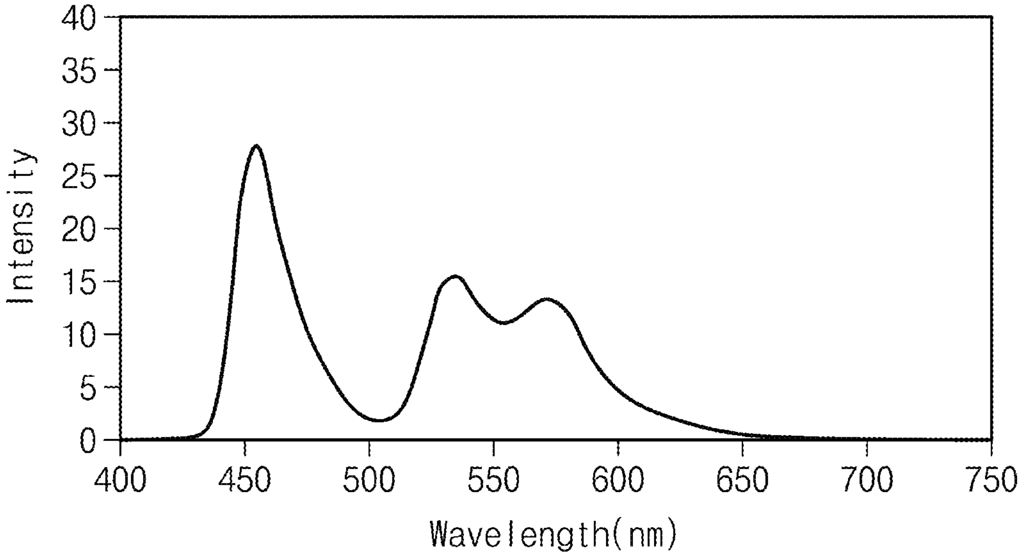
FIG. 9 is a view showing the wavelength characteristics of source light according to an embodiment.

FIG. 9 is a view showing the wavelength characteristics of source light according to an embodiment. FIG. 9 shows the spectrum of source light provided from the display layer DP-ED (FIG. 5) of the display device according to an embodiment. FIG. 9 shows the spectrum of light emission intensity according to wavelength.

Referring to FIG. 9, the source light may include a peak having a maximum intensity between about 450 nm and about 470 nm and a peak having a maximum intensity between about 520 nm and about 570 nm. The source light provided from the display layer DP-ED (FIG. 5) may include light in the blue wavelength range and light in the green wavelength range. Light in the blue wavelength range may pass through the light control layer or be provided to quantum dots included in the light control layer to emit wavelength-converted light. Light in the green wavelength range may also pass through the light control layer or be provided to quantum dots included in the light control layer to emit wavelength-converted light.

In case that the source light containing light in the green wavelength range may be provided to the green light control portion CCP-G (FIG. 5), the source light may be emitted through the green light control portion CCP-G (FIG. 5).

The display device according to an embodiment may include modified scatterers aligned in a direction parallel to a main travel direction of source light provided from the display layer and provided to the light control layer in the light control portion, and may thus minimize scattering of light emitted upon passing through the light control portion, and accordingly, the amount of light emitted to the front surface increases, thereby increasing the luminance of the display device as well. In particular, in the display device of an embodiment including a display layer that may provide source light may include both blue light and green light, and a light control layer disposed on the display layer, the green light control portion may include modified scatterers, and accordingly, the green light transmitted and emitted from the green light control portion may increase. Accordingly, the light efficiency of a green pixel region increases and the display quality of the display device may also be improved.

Figure 10:
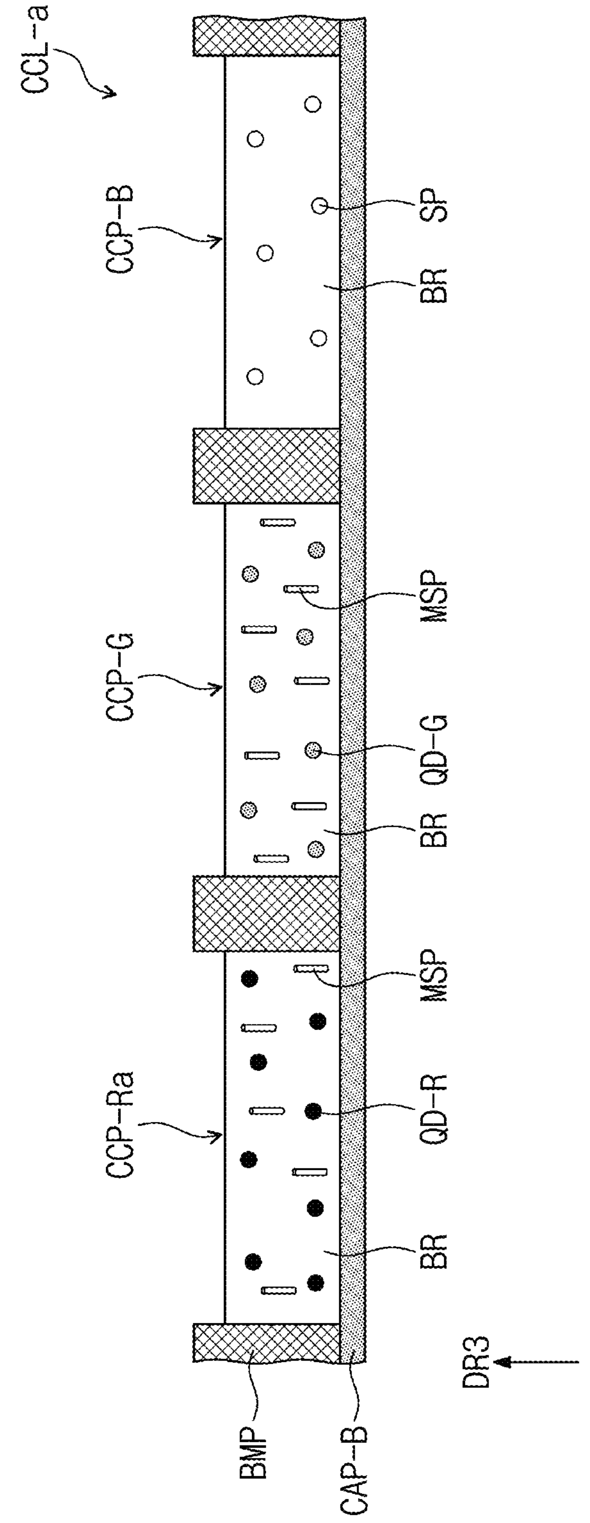
FIG. 10 is a schematic cross-sectional view of a light control layer according to an embodiment.

FIG. 10 is a schematic cross-sectional view of a light control layer according to an embodiment. A light control layer CCL-a according to an embodiment shown in FIG. 10 may be included in the light control panel OP of the display device DD described with reference to FIG. 5 and the like. The content of light control layer CCL according to an embodiment described with reference to FIGS. 1 to 8B and the like may also apply to the light control layer CCL-a of an embodiment shown in FIG. 10.

The light control layer CCL-a of an embodiment shown in FIG. 10 is different from the light control layer CCL of an embodiment shown in FIG. 6 in that the light control layer CCL-a of an embodiment shown in FIG. 10 may include modified scatterers MSP in a first light control portion CCP-Ra.

The light control layer CCL-a of an embodiment may include a first light control portion CCP-Ra including red quantum dots QD-R and modified scatterers MSP, a second light control portion CCP-G including green quantum dots QD-G and modified scatterers MSP, and a third light control portion CCP-B including spherical scatterers SP. The first to third light control portions CCP-Ra, CCP-G, and CCP-B may each include a base resin portion BR.

In the light control layer CCL-a of an embodiment, the first light control portion CCP-Ra and the second light control portion CCP-G may include the modified scatterers MSP and accordingly, among the incident source light, the amount of light transmitted through the light control portions CCP-Ra and CCP-G and emitted to the front surface may increase. In case that the light control layer CCL-a of the embodiment shown in FIG. 10 is applied, the source light may include blue light, green light, and red light. In case that the light control layer CCL-a of an embodiment shown in FIG. 10 is applied, the spectrum of the source light emitted from the display layer DP-ED (FIG. 5) of the display device DD (FIG. 5) may include a peak in the blue light wavelength range, a peak in the green light wavelength range, and a peak in the red light wavelength range.

Figure 11:
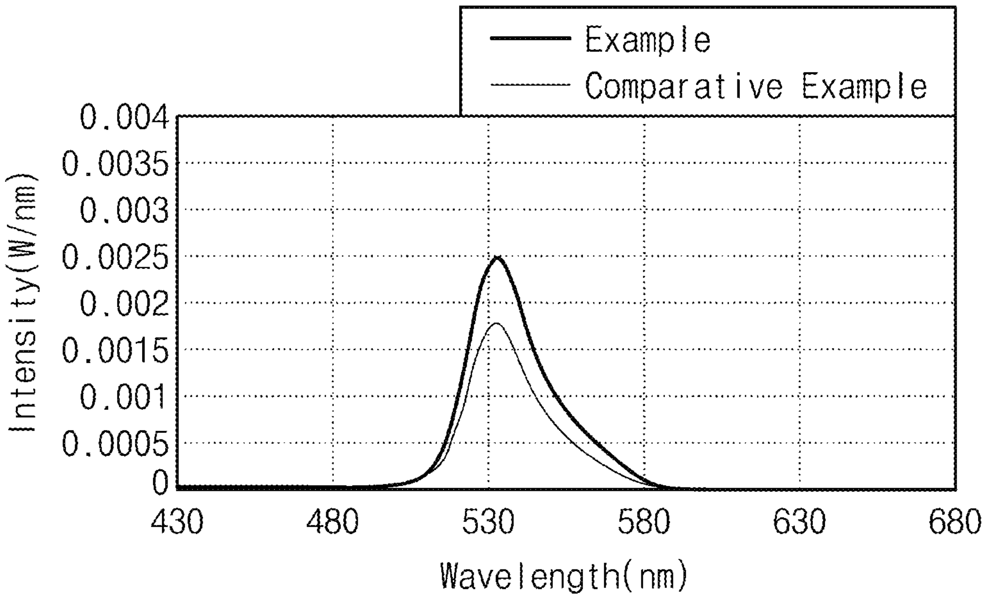
FIG. 11 is a view showing optical characteristics according to wavelength in a Comparative Example and an Example according to an embodiment.

FIG. 11 and Table 1 show the results of evaluating the characteristics of light control portions of Comparative Examples and Examples according to an embodiment. Comparative Examples in FIG. 11 and Table 1 are for typical green light control portions shown in FIG. 8A, and Examples according to an embodiment may be for green light control portions of an embodiment shown in FIG. 8B. Comparative Examples include a spherical $TiO_2$ scatterer having a diameter of about 180 nm, and Examples according to an embodiment include a modified scatterer including a $TiO_2$ core portion having a long side length of about 180 nm and a short side length of about 100 nm and a metal coating portion of Al.

FIG. 11 is a view showing optical characteristic according to wavelength in a comparative Example and an Example according to an embodiment. FIG. 11 shows the intensity of light emitted from the light control portions of a Comparative Example and an Example according to an embodiment. The Comparative Example in FIG. 11 show the light output characteristics of typical green light control portions, and the Example according to an embodiment in FIG. 11 show the light output characteristics of green light control portions of an embodiment.

Comparing the Comparative Example and the Example according to an embodiment shown in FIG. 11, it may be seen that the Example according to an embodiment show high emission intensity in the same wavelength range. It may be seen that the Example according to an embodiment show better light output characteristics than the Comparative Example in the green light emission wavelength in a range of about 520 nm to about 570 nm.

Table 1 below shows the optical property evaluation results of the Comparative Example and the Example according to an embodiment. In Table 1, “EQE” indicates the conversion efficiency of blue light of about 450 nm to green light, which may be provided as light conversion efficiency, and the Comparative Example was set as (or normalized to) 100% and the Example according to an embodiment was shown in a relative ratio. The luminance in Table 1 may be shown in a relative ratio of the luminance value measured at an upper portion of the light control portion in case that the source light shown in FIG. 9 is provided, compared to the Comparative Example. SCI and SCE each represent reflected light shown in a relative ratio compared to the Comparative Example. The two above may be different in that SCI may include specularly reflected light and SCE comes with removed specularly reflected light.

TABLE 1

| Item | EQE | Luminance | SCI | SCE |
|---|---|---|---|---|
| Comparative Example | 100% | 100% | 100% | 100% |
| Example according to an embodiment | 90.8% | 106.4% | 98.3 | 89.5% |

Referring to Table 1, the light conversion efficiency in case that the blue light of about 450 nm was provided was partially reduced in the Example according to an embodiment, but the luminance of the Example according to an embodiment was increased compared to the Comparative Example. It may be seen that even in case that the light conversion efficiency is partially reduced, the final luminance of the light control portion in the Example according to an embodiment shows an improvement due to high light transmittance in the light control portion. It may be seen that the Example according to an embodiment shows reduced reflectance compared to the Comparative Example. Accordingly, it may be seen that the Example according to an embodiment has high luminance and low reflectance compared to the Comparative Example, and thus show excellent optical properties.

Hereinafter, a method for manufacturing a display device of an embodiment will be described with reference to FIGS. 12A to 12C and the like.

A method for manufacturing a display device of an embodiment may include forming a display panel including a light emitting element, and forming a light control layer, and the forming of the light control layer may include forming a division pattern in which multiple openings may be defined on a base portion, and forming a blue light control portion, a green light control portion, and a red light control portion in respective ones of the openings. In an embodiment, in the forming of a light control layer, the forming of a green light control portion may include providing quantum dot ink including green quantum dots and modified scatterers in the opening, aligning the modified scatterers such that long sides of the provided modified scatterers are parallel to a thickness direction of the green light control portion, and curing the quantum dot ink after the aligning of the modified scatterers. The modified scatterers included in the quantum dot ink include a core portion whose length in the long side direction may be about 1.5 times or greater than a length in the short side direction perpendicular to the long side direction, and a metal coating portion surrounding at least one of an upper portion and a lower portion of the core portion, the upper portion and the lower portion of the core portion may be spaced apart in the long side direction.

In the modified scatterers, the core portion may include $TiO_2$, $SiO_2$, $BaSO_4$, ZnO, $Al_2O_3$, $CaCO_3$, or a combination thereof, and the metal coating portion may include Al Cu, or a combination thereof.

The display device DD (FIG. 5) of an embodiment described with reference to FIGS. 1 to 9 and the like may be manufactured using the method for manufacturing a display device of an embodiment. The display device manufactured by the method for manufacturing a display device of an embodiment will be described later with reference to FIGS. 5 and 12A to 12C.

In the method for manufacturing a display device of an embodiment, the forming of the display panel DP and the forming of the light control layer CCL may be each performed through separate processes, and the display panel DP and the light control panel OP including the light control layer CCL may be combined to form the display device DD. However, for example, the light control layer CCL may be manufactured to be provided on an upper portion of the display panel DP after the manufacturing of the display panel DP.

The forming of the light control layer CCL may include forming a division pattern BMP in which multiple openings BW-OH may be defined on a base portion BW. The base portion BW may be a portion that serves as a base surface on which the divided pattern BMP and light control portions CCP-R, CCP-G, and CCP-B may be provided. In an embodiment shown in FIG. 5, the base portion BW may be a second barrier layer CAP-B. In an embodiment shown in FIG. 5, the base portion BW may be a second barrier layer CAP-B disposed on the upper surface of the display panel DP. However, the embodiment of the inventive concept may not be limited thereto. In an embodiment, upon manufacturing the light control panel OP, in case that the color filter layer CFL is formed first, and the light control layer CCL is formed, the base portion BW may be the color filter layer CFL or other components of a light control panel disposed on an upper portion of the light control portions CCP-R, CCP-G, and CCP-B.

The blue light control portion CCP-B, the green light control portion CCP-G, and the red light control portion CCP-R of the light control layer CCL may each be formed sequentially. However, the embodiment of the inventive concept may not be limited thereto, and after the providing of ink for forming each light control portion is performed, curing for forming each light control portion may be performed.

Figure 12A:
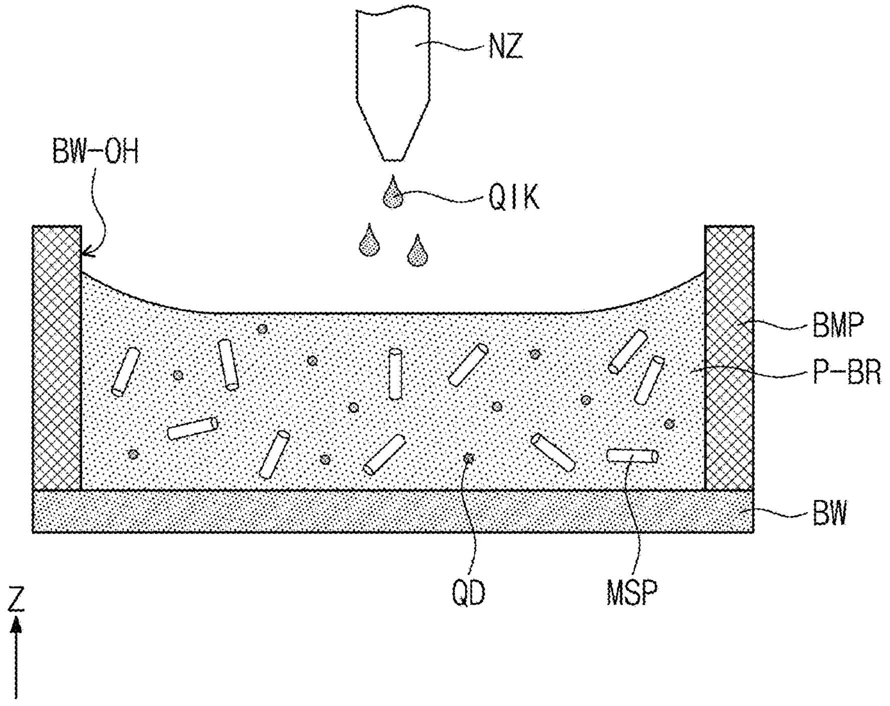
FIGS. 12A to 12C are each views showing a step in a method for manufacturing a display device according to an embodiment.

FIG. 12A shows providing quantum dot ink as an example. In an embodiment, the forming of the green light control portion CCP-G may include providing quantum dot ink QIK including green quantum dots QD and modified scatterers MSP in the opening BW-OH. The quantum dot ink QIK may include a base resin P-BR. The base resin P-BR may correspond to a binder material before curing. The base resin P-BR may be an acrylate-based resin, a urethane-based resin, a silicone-based resin, an epoxy-based resin, or a combination thereof.

The modified scatterers MSP included in the quantum dot ink QIK may be dispersed in the base resin P-BR and provided randomly. The quantum dot ink QIK may be provided through a nozzle NZ of inkjet printing equipment. The quantum dot ink QIK may be sprayed into the opening BW-OH using an inkjet printing method.

Figure 12B:
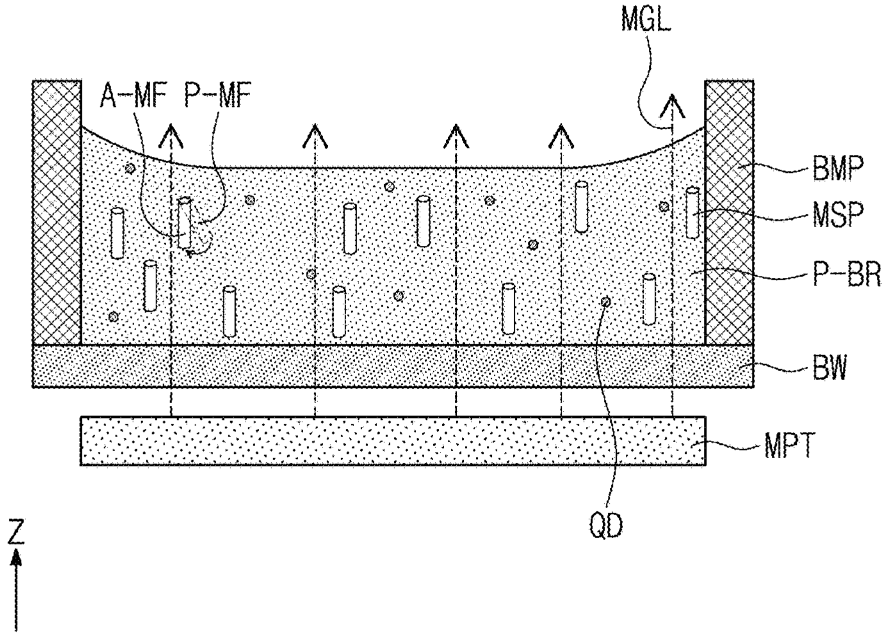

FIG. 12B is a view showing aligning modified scatterers. The modified scatterers MSP may be aligned such that the long side of the modified scatterers MSP included in the quantum dot ink QIK (FIG. 12A) provided in the opening BW-OH (FIG. 12A) is in parallel with the Z-axis direction (Z), which may be the thickness direction of the light control layer CCL.

The modified scatterers MSP may be arranged to be aligned in a direction in the base resin P-BR. A magnetic field MGL may be provided (or applied) to the provided quantum dot ink QIK so that the modified scatterers MSP may be aligned. The modified scatterers MSP may be arranged in a second state A-MF aligned in a direction from a first state P-MF arranged in a random direction after the providing of the magnetic field. The magnetic field MGL may be provided from a magnetic field generating device MPT disposed below the base portion BW. The modified scatterers MSP may be aligned in the direction in which the magnetic field MGL may be provided. The modified scatterers MSP may include a metal coating portion ML at an end and may thus be aligned such that an end may be biased to a side according to the direction in which the magnetic field MGL is provided. In FIG. 12B, the magnetic field generating device MPT may be shown to be disposed below the base portion BW, but the embodiment of the inventive concept may not be limited thereto and the magnetic field generating device MPT may be disposed above the provided quantum dot ink QIK to provide the magnetic field MGL.

Figure 12C:
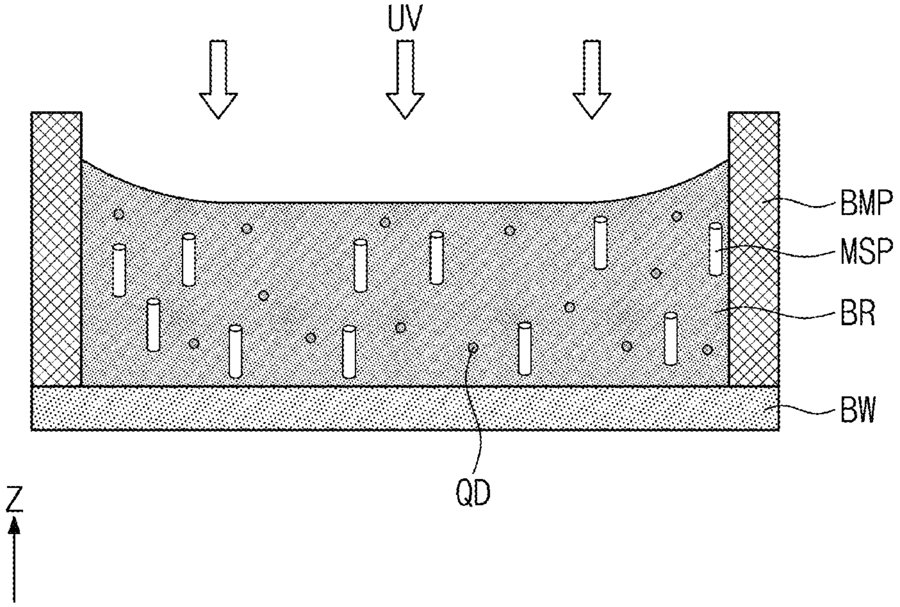

FIG. 12C is a view showing curing quantum dot ink. As shown in FIG. 12B, the curing of quantum dot ink may be performed after (or simultaneously with) the aligning of modified scatterers. The curing of quantum dot ink may include providing ultraviolet light (UV) to the quantum dot ink. The quantum dot ink may be cured by provided ultraviolet light (UV) to form a light control portion CCP-G. In the curing of quantum dot ink, a base resin P-BR may be cured to form a base resin portion BR. Quantum dots QD and modified scatterers MSP may be fixed and dispersed in the base resin portion BR. The modified scatterers MSP may be fixed and included in the light control portion CCP-G in an aligned state by the magnetic field MGL.

The curing of quantum dot ink may include thermal curing that provides heat instead of ultraviolet light. For example, the curing of quantum dot ink may include providing additional heat after the providing of ultraviolet light.

Although not shown, the forming of the blue light control portion CCP-B may include spraying ink containing spherical scatterers SP into the opening BW-OH through an inkjet printing method to provide the ink, and curing the provided ink.

The forming of the red light control portion CCP-R may also include spraying quantum dot ink containing red quantum dots into the opening BW-OH through an inkjet printing method, and curing the provided quantum dot ink. In case that the red light control portion CCP-R may include the modified scatterers MSP, the forming of the red light control portion may further include aligning the modified scatterers MSP as described with reference to FIG. 12B.

The method for manufacturing a display device of an embodiment may include providing (or disposing) quantum dot ink containing modified scatterers, aligning the modified scatterers, and forming a light control layer including curing the quantum dot ink after (or during) the aligning of the modified scatterers, and may thus be used to manufacture a display device having improved light extraction efficiency. In the method for manufacturing a display device of an embodiment, in the aligning of the modified scatterers, the modified scatterers including the metal coating portion coated on an end may be aligned in parallel in a direction to increase light transmission efficiency in the light control portion, and may thus be used to manufacture a display device having improved luminance.

The display device of an embodiment may include the light control portion including quantum dots and modified scatterers, and has the modified scatterers aligned to be in parallel with a direction in which source light may be provided to increase the transmittance of a portion of the source light, and may thus exhibit excellent luminance characteristics.

A display device of an embodiment may include rod-like modified scatterers arranged in parallel with a direction in which source light may be provided to increase the transmittance of the source light in a light control layer, and may thus exhibit improved luminance characteristics.

A method for manufacturing a display device of an embodiment may include arranging rod-like scatterers parallel to a direction in which source light may be provided to increase light transmittance in a light control layer, and may thus provide a display device having improved luminance characteristics.

Although the disclosure has been described with reference to an embodiment of the inventive concept, it will be understood that the inventive concept should not be limited to these embodiments but various changes and modifications may be made by those skilled in the art without departing from the spirit and scope of the disclosure.

Accordingly, the technical scope of the inventive concept may not be intended to be limited to the contents set forth in the detailed description of the specification, but may be intended to be defined by the appended claims.

What is claimed is:

1. A display device comprising:

a display layer to produce a source light; and a light control layer disposed on the display layer to transmit the source light or to wavelength-convert the source light, wherein the light control layer includes a red light control portion to emit red light, a green light control portion to emit green light, and a blue light control portion to emit the source light, the green light control portion includes a plurality of first quantum dots and a plurality of modified scatterers, the plurality of modified scatterers each include a core portion and a metal coating portion, a length of the core portion in a long side direction of the core portion is about 1.5 times or greater than a length of the core portion in a short side direction of the core portion perpendicular to the long side direction in a cross-section perpendicular to the display layer, the metal coating portion surrounds at least one of an upper portion and a lower portion of the core portion, and the upper portion and the lower portion of the core portion are spaced apart in the long side direction.

2. The display device of claim 1, wherein the core portion has a rod-like shape, and the metal coating portion covers one surface, which is an upper surface or a lower surface of the core portion, and a side surface of the core portion extending from the one surface.

3. The display device of claim 1, wherein the plurality of modified scatterers are arranged such that the long side direction is perpendicular to an upper surface of the display layer.

4. The display device of claim 1, wherein in each of the plurality of modified scatterers, the length in the long side direction is in a range of about 50 nm to about 500 nm, and the length in the short side direction is in a range of about 20 nm to about 200 nm.

5. The display device of claim 1, wherein the core portion comprises $TiO_2$, $SiO_2$, $BaSO_4$, ZnO, $Al_2O_3$, $CaCO_3$, or a combination thereof.

6. The display device of claim 1, wherein the metal coating portion comprises Al, Cu, or a combination thereof.

7. The display device of claim 1, wherein the source light comprises blue light and green light.

8. The display device of claim 1, wherein the source light comprises blue light, green light, and red light, and the red light control portion comprises the plurality of modified scatterers and a plurality of second quantum dots, the plurality of second quantum dots are different from the plurality of first quantum dots.

9. The display device of claim 1, wherein the blue light control portion comprises a plurality of spherical scatterers.

10. The display device of claim 1, wherein the display layer comprises a light emitting element to emit the source light, and the light emitting element includes a first electrode, a second electrode facing the first electrode, and a light emitting portion disposed between the first electrode and the second electrode.

11. A display device comprising:

a first pixel region to emit red light, a second pixel region to emit green light, and a third pixel region to emit blue light spaced apart from each other and not overlapping each other in a plan view, the display device further comprising:

a display panel including a light emitting element; and a light control panel disposed on the display panel, the light control panel including a light control layer having a first light control portion corresponding to the first pixel region, a second light control portion corresponding to the second pixel region, and a third light control portion corresponding to the third pixel region, wherein the second light control portion includes a plurality of first quantum dots and a plurality of rod-like modified scatterers whose length in a first direction parallel to a thickness direction of the light control layer is about 1.5 times or greater than a length in a second direction perpendicular to the first direction, the modified scatterers each include a rod-like core portion and a metal coating portion surrounding at least one of an upper surface and a lower surface of the core portion, and the upper surface and the lower surface of the core portion are spaced apart in the first direction.

12. The display device of claim 11, wherein the core portion comprises $TiO_2$, $SiO_2$, $BaSO_4$, ZnO, $Al_2O_3$, $CaCO_3$, or a combination thereof, and the metal coating portion comprises Al, Cu, or a combination thereof.

13. The display device of claim 11, wherein the light emitting element emits source light including the blue light and the green light, the third light control portion contains spherical scatterers, and the second light control portion contains no scatterers.

14. The display device of claim 11, wherein the light control panel further comprises a color filter layer spaced apart from the display panel and disposed on the light control layer, and the color filter layer comprises a first color filter overlapping the first pixel region in a plan view to transmit the red light, a second color filter overlapping the second pixel region in a plan view to transmit the green light, and a third color filter overlapping the third pixel region in a plan view to transmit the blue light.

15. A method for manufacturing a display device, the method comprising:

forming a display panel including a light emitting element; and forming a light control layer, wherein the forming of the light control layer includes:

forming a division pattern in which a plurality of openings are defined on a base portion; and forming a blue light control portion, a green light control portion, and a red light control portion that correspond to each of the openings, wherein the forming of the green light control portion includes:

disposing quantum dot ink including green quantum dots and modified scatterers in one of the openings corresponding to the green light control portion;

aligning the modified scatterers such that long sides of the disposed modified scatterers are parallel to a thickness direction of the green light control portion; and curing the quantum dot ink after the aligning of the modified scatterers, wherein each of the modified scatterers includes a core portion whose length in a long side direction is about 1.5 times or greater than a length in a short side direction perpendicular to the long side direction, and a metal coating portion surrounding at least one of an upper portion and a lower portion of the core portion, and the upper portion and the lower portion of the core portion are spaced apart in the long side direction.

16. The method of claim 15, wherein the aligning of the modified scatterers comprises applying a magnetic field to the quantum dot ink disposed in the one of the openings corresponding to the green light control portion.

17. The method of claim 15, wherein the core portion comprises $TiO_2$, $SiO_2$, $BaSO_4$, ZnO, $Al_2O_3$, $CaCO_3$, or a combination thereof, and the metal coating portion comprises Al, Cu, or a combination thereof.

18. The method of claim 15, wherein the disposing of the quantum dot ink comprises spraying the quantum dot ink through an inkjet printing method.

19. The method of claim 15, wherein the curing of the quantum dot ink comprises irradiating ultraviolet light into the quantum dot ink.

20. The method of claim 15, wherein the forming of the blue light control portion comprises:

spraying ink containing spherical scatterers into one of the openings corresponding to the blue light control portion through an inkjet printing method; and curing the sprayed ink.

* * * * *